United States Patent
Iizuka

(10) Patent No.: US 9,785,221 B2
(45) Date of Patent: Oct. 10, 2017

(54) POWER CONTROL OF A PLURALITY OF FUNCTIONAL UNITS

(71) Applicant: CANON KABUSHIKI KAISHA, Tokyo (JP)

(72) Inventor: Toshiaki Iizuka, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 388 days.

(21) Appl. No.: 14/479,062

(22) Filed: Sep. 5, 2014

(65) Prior Publication Data
US 2015/0089257 A1    Mar. 26, 2015

(30) Foreign Application Priority Data
Sep. 26, 2013 (JP) ................................. 2013-200522

(51) Int. Cl.
G06F 1/26 (2006.01)
G06F 1/32 (2006.01)
G06F 12/02 (2006.01)
G11C 11/406 (2006.01)

(52) U.S. Cl.
CPC .............. G06F 1/3284 (2013.01); G06F 1/32 (2013.01); G06F 12/0223 (2013.01); G11C 11/406 (2013.01); G11C 11/40615 (2013.01); G11C 11/40618 (2013.01); G11C 2211/4067 (2013.01)

(58) Field of Classification Search
None
See application file for complete search history.

(56) References Cited

U.S. PATENT DOCUMENTS

| | | | | |
|---|---|---|---|---|
| 5,860,125 A | * | 1/1999 | Reents | G06F 1/24 365/227 |
| 6,546,472 B2 | * | 4/2003 | Atkinson | G06F 12/08 711/156 |
| 7,827,424 B2 | * | 11/2010 | Bounitch | G06F 1/3203 713/320 |

(Continued)

FOREIGN PATENT DOCUMENTS

| | | |
|---|---|---|
| CN | 102025866 A | 4/2011 |
| CN | 102063178 A | 5/2011 |

(Continued)

OTHER PUBLICATIONS

U.S. Appl. No. 14/519,411, filed Oct. 21, 2014. Applicant: Toshiaki Iizuka.

(Continued)

*Primary Examiner* — Nitin Patel
(74) *Attorney, Agent, or Firm* — Fitzpatrick, Cella, Harper & Scinto

(57) ABSTRACT

An image processing apparatus having a plurality of functional units that respectively execute predetermined functions, a method of controlling the apparatus, the apparatus manages a memory with a plurality of areas, and allocates the plurality of areas of the memory to the plurality of functional units respectively. Then, when, in a power saving state, at least one of the plurality of functional units is caused to transition into a power saving state, the apparatus stops a refreshing of the area of the memory allocated to the functional unit that is caused to transition into the power saving state.

8 Claims, 17 Drawing Sheets

(56) References Cited

U.S. PATENT DOCUMENTS

| | | | |
|---|---|---|---|
| 7,953,904 B2* | 5/2011 | Hemmi | G06F 3/0625 |
| | | | 710/16 |
| 8,082,387 B2 | 12/2011 | DiZenzo | |
| 2002/0191466 A1* | 12/2002 | Hwang | G11C 7/1018 |
| | | | 365/222 |
| 2006/0028880 A1 | 2/2006 | Mikami et al. | |
| 2007/0014178 A1* | 1/2007 | Fujioka | G06F 1/3203 |
| | | | 365/227 |
| 2007/0180187 A1* | 8/2007 | Olson | G06F 12/10 |
| | | | 711/106 |
| 2009/0172270 A1* | 7/2009 | Kardach | G06F 12/0223 |
| | | | 711/105 |
| 2009/0201558 A1 | 8/2009 | Kida | |
| 2011/0060924 A1* | 3/2011 | Khodorkovsky | G06F 1/3203 |
| | | | 713/300 |
| 2011/0173477 A1* | 7/2011 | Asaba | G06F 1/3203 |
| | | | 713/323 |
| 2011/0296095 A1* | 12/2011 | Su | G06F 12/0292 |
| | | | 711/105 |
| 2012/0089773 A1* | 4/2012 | Chang | G11C 11/40622 |
| | | | 711/106 |
| 2012/0239952 A1* | 9/2012 | Nishiguchi | G06F 1/3206 |
| | | | 713/320 |

FOREIGN PATENT DOCUMENTS

| | | |
|---|---|---|
| CN | 102263874 A | 11/2011 |
| EP | 1020866 A1 | 7/2000 |
| EP | 2343657 A1 | 7/2011 |
| JP | 5229326 B2 | 7/2013 |
| KR | 10-2011-0027545 A | 3/2011 |

OTHER PUBLICATIONS

European Search Report dated Jan. 20, 2015 in European Patent Application No. 14003114.7.

Chinese Office Action dated Apr. 27, 2017 in Chinese Application No. 201410497142.3.

* cited by examiner

POWER CONTROL OF A PLURALITY OF FUNCTIONAL UNITS

BACKGROUND OF THE INVENTION

Field of the Invention

The present invention relates to an image processing apparatus, a method of controlling the same, and storage medium.

Description of the Related Art

Demand for reducing electric power consumption in image forming apparatuses has been growing. Reducing electric power consumption during standby by reducing from what is normal the electric power supply to a main controller of an apparatus when the apparatus is in a non-operating state is performed as a counter-measure for this demand. Such a power saving state in which the electric power consumption is reduced is generally referred to as a sleep mode. There are cases in which such a sleep mode is treated as a powered off state of the apparatus due to the spread of a soft switch (a switch that is controlled indirectly via a controller IC rather than being controlled by the turning on and turning off of the electric power supply by a hardware switch).

Meanwhile, in the main controller of such an apparatus, generally DRAM is used. With DRAM, it is necessary to maintain data held in the DRAM with a periodic energization referred to as a refresh. It is necessary to reconstruct data of a DRAM upon recovery from a sleep mode when the data held in the DRAM is lost during the sleep mode, and so a lot of time is required for the recovery from the sleep mode. In order to reduce such time, a self-refresh for maintaining the data of the DRAM by periodically energizing at a DRAM energization interval (a refresh cycle) that is as long as possible is used during the period from when the apparatus shifts to the sleep mode until when the apparatus recovers from the sleep mode.

The electric power consumption amount when energizing in the DRAM self-refresh has come to be considered to be a negligible amount out of the electric power consumption amount consumed in the sleep mode. However, the size of the DRAM mounted has been increasing and so the electric power consumption amount due to self-refreshing of the DRAM has come to no longer be negligible due to the reduction of the electric power consumption of parts of the apparatus other than the DRAM.

U.S. Pat. No. 8,082,387 discloses a technique for reducing electric power consumed in a memory refresh by dividing the memory, which is managed by an OS, into a plurality of blocks, and stopping refreshing of blocks to which memory segments are not allocated.

With the above described conventional example, because the memory managed by the OS is managed divided into the plurality of blocks, a sufficient power saving effect cannot be achieved when the technique is applied in a case of an image processing apparatus having a plurality of functions such as, for example, a multi function peripheral.

SUMMARY OF THE INVENTION

An aspect of the present invention is to eliminate the above-mentioned problems with conventional technology.

A feature of the present invention is to provide a technique for reducing an electric power consumption amount by reducing the electric power consumption amount of a memory, when, in accordance with this, an electric power supply to each unit in a power saving state is disconnected or reduced.

The present invention in its first aspect provides an image processing apparatus having a plurality of functional units that respectively execute predetermined functions, the apparatus comprising: a management unit configured to manage a memory with a plurality of areas; an allocation unit configured to allocate the plurality of areas of the memory to the plurality of functional units respectively; and a control unit configured to control so as to, when, in a power saving state, at least one of the plurality of functional units is caused to transition into the power saving state, stop a refreshing of the area of the memory allocated to the functional unit that is caused to transition into the power saving state.

The present invention in its second aspect provides a method of controlling an image processing apparatus having a plurality of functional units that respectively execute predetermined functions, the method comprising: managing a memory with a plurality of areas; allocating the plurality of areas of the memory to the plurality of functional units respectively; and controlling so as to, when, in a power saving state, at least one of the plurality of functional units is caused to transition into the power saving state, stop a refreshing of the area of the memory allocated to the functional unit that is caused to transition into the power saving state.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Embodiments of the present invention will now be described hereinafter in detail, with reference to the accompanying drawings. It is to be understood that the following embodiments is not intended to limit the claims of the present invention, and that not all of the combinations of the aspects that are described according to the following embodiments are necessarily required with respect to the means to solve the problems according to the present invention.

It is to be understood that while an image processing apparatus which is a target of the present invention is explained with examples of an image forming apparatus such as, for example, a multi function peripheral in the present embodiment, the present invention is not limited to such a multi function peripheral.

Figure 1:
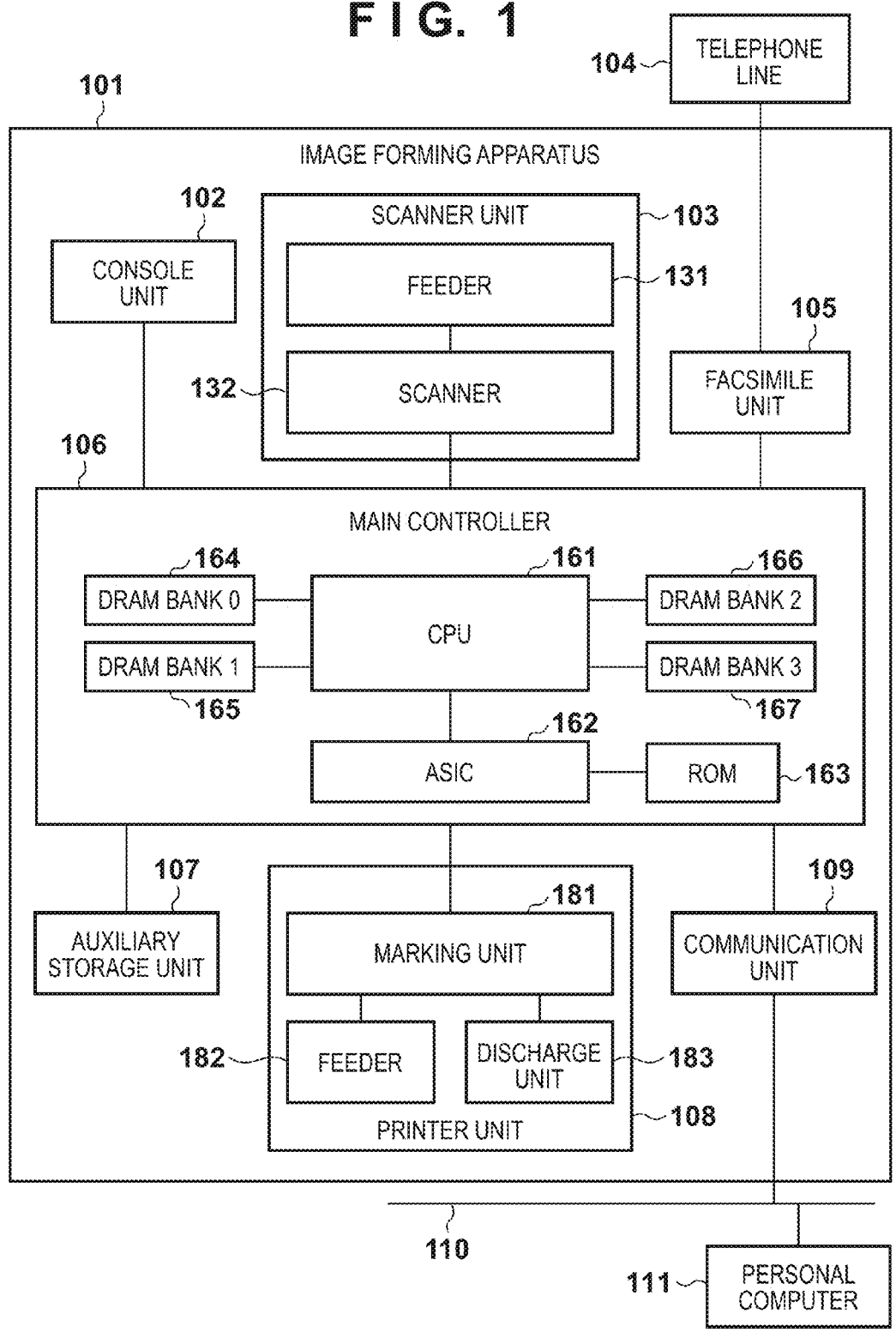
FIG. 1 is a block diagram for explaining a hardware configuration of an image forming apparatus according to embodiments.

FIG. 1 is a block diagram for explaining a hardware configuration of an image forming apparatus 101 according to embodiments.

This image forming apparatus 101 is provided with a console unit 102, a scanner unit 103, a facsimile unit 105 that is connected to a telephone line 104 and performs a facsimile communication, a main controller 106, an auxiliary storage unit 107, a printer unit 108, and a communication unit 109 that communicates with a network 110. The console unit 102 is provided with keys for receiving an operation from a user or a display unit for displaying a message for a user. Note, the display unit may be provided with a touch panel function. The scanner unit 103 reads original documents optically and converts an image of an original document to digital image data. The facsimile unit 105 transmits and receives digital image data with the telephone line 104. The auxiliary storage unit 107 stores digital image data, a control program or the like. The printer unit 108 prints an image on a sheet, such as a piece of paper, based on digital image data. The main controller 106 controls the scanner unit 103, the facsimile unit 105, the auxiliary storage unit 107 and the printer unit 108 which are connected. The main controller 106 performs printing by controlling the printer unit 108 in a case of receiving a print job from a personal computer 111 connected via the communication unit 109. Note, the image forming apparatus 101 can receive digital image data from the computer 111 via the network 110, and the computer 111 can perform issuing of a job, instructing of a device, or the like, towards the image forming apparatus 101.

The scanner unit 103 comprises a feeder 131 which is capable of performing paper feeding one sheet at a time, a plurality of sheets having been placed on it, and a scanner 132 for scanning an original document and converting an image on the document to digital image data, and converted image data is transmitted to the main controller 106. The printer unit 108 comprises a marking unit 181 for printing an image on a sheet fed from a feeder 182, and the feeder 182 which is for feeding one sheet at a time, a plurality of sheets having been stacked in it, and a discharge unit 183 for discharging a sheet after printing.

The main controller 106 comprises a CPU 161 for calculation, an ASIC 162 (application specific integrated circuit) for performing various control for the main controller 106 including electric power supply control, and a ROM 163 for storing settings of the main controller 106 and start-up programs. Furthermore, the main controller 106 has a DRAM bank 164 (a bank 0), a DRAM bank 165 (a bank 1), a DRAM bank 166 (a bank 2), and a DRAM bank 167 (a bank 3) used by the CPU 161. Here, the banks indicate control units of DRAM, and the control of DRAM is performed having divided the DRAM into the four areas of the bank 0 through the bank 3 in the present embodiment. In FIG. 1, for example the main controller 106 includes a large number of various electric circuits, ICs, or the like, such as a clock generator or a decoder, but it is shown omitting these because they are not necessary to explain the present invention.

Figure 2:
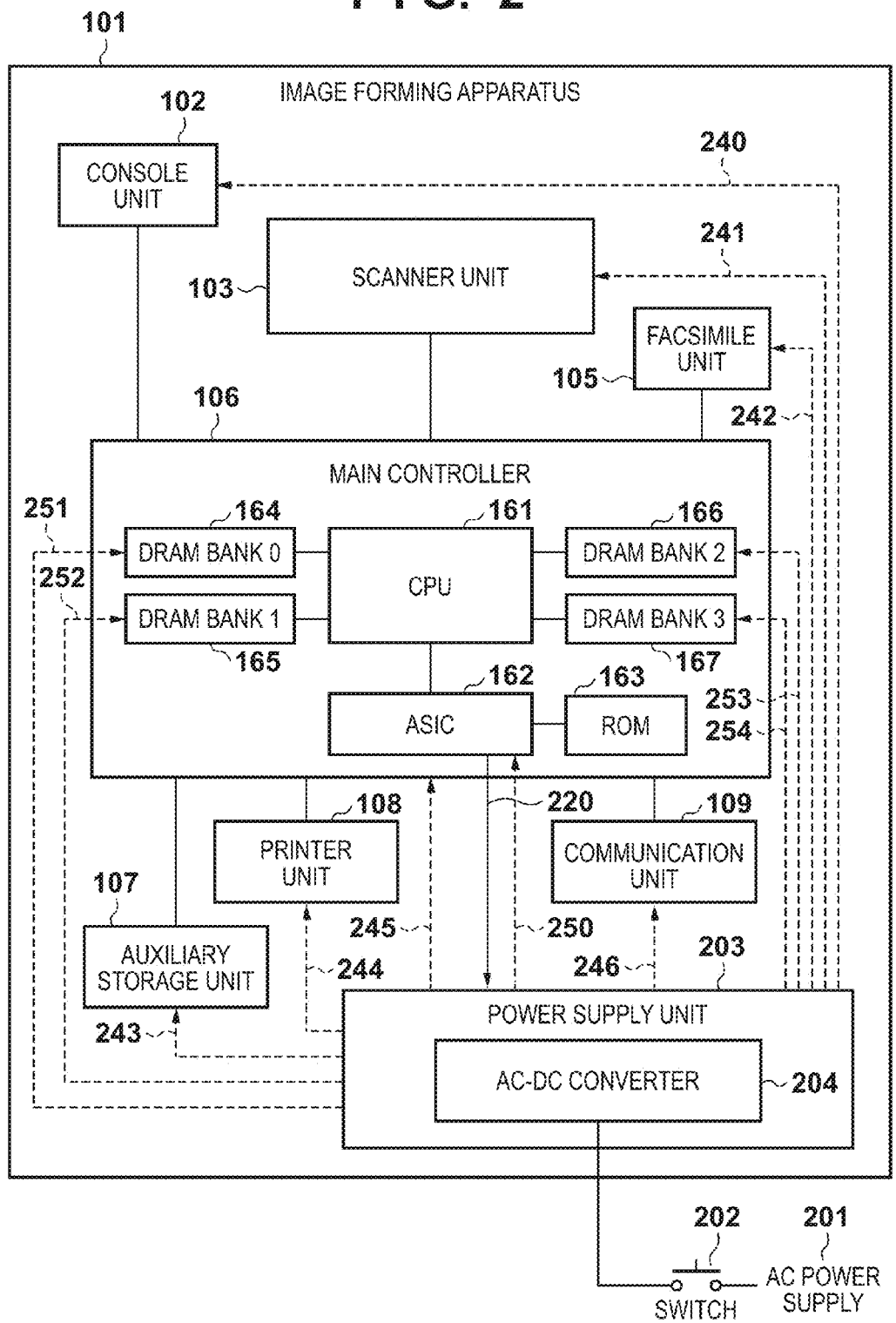
FIG. 2 is a block diagram for explaining routes of an electric power supply in the image forming apparatus according to embodiments.

FIG. 2 is a block diagram for explaining routes of an electric power supply in the image forming apparatus 101 according to embodiments. Note the parts common to FIG. 1 are indicated with the same reference numerals.

Alternating current electric power supplied from a commercial AC power supply 201 is supplied to an AC-DC converter 204 of a power supply unit 203 via a switch 202, and electric power converted to direct current electric power in the AC-DC converter 204 is supplied to each part of the image forming apparatus 101 through power supply lines. More specifically, the electric power is supplied through a power supply line 240 for the console unit 102, a power supply line 241 for the scanner unit 103, a power supply line 242 for the facsimile unit 105, a power supply line 243 for the auxiliary storage unit 107, and a power supply line 244 for the printer unit 108. Furthermore, direct current electric power is supplied through a power supply line 245 for the main controller 106, and a power supply line 246 for the communication unit 109. An electric power is supplied to an ASIC 162 through a power supply line 250 and to each DRAM bank through power supply lines 251-254 separately from the power supply line 245 for power supply to the entirety of the main controller 106. Here, an electric power is supplied to the DRAM bank 164 (the bank 0) through the power supply line 251, to the DRAM bank 165 (the bank 1) through the power supply line 252, to the DRAM bank 166 (the bank 2) through the power supply line 253, and to the DRAM bank 167 (the bank 3) through the power supply line 254 independently from each other. Control for performing the electric power supply through the power supply lines, which are respectively independent, is performed by the power supply unit 203, but a setting as to which kind of electric power to supply to the power supply unit 203 is performed from the ASIC 162 on the main controller 106 through a setup signal line 220. Therefore, the electric power supply and disconnection of the electric power supply to each unit according to the following embodiments is controlled by the setup signal line 220.

Figure 3:
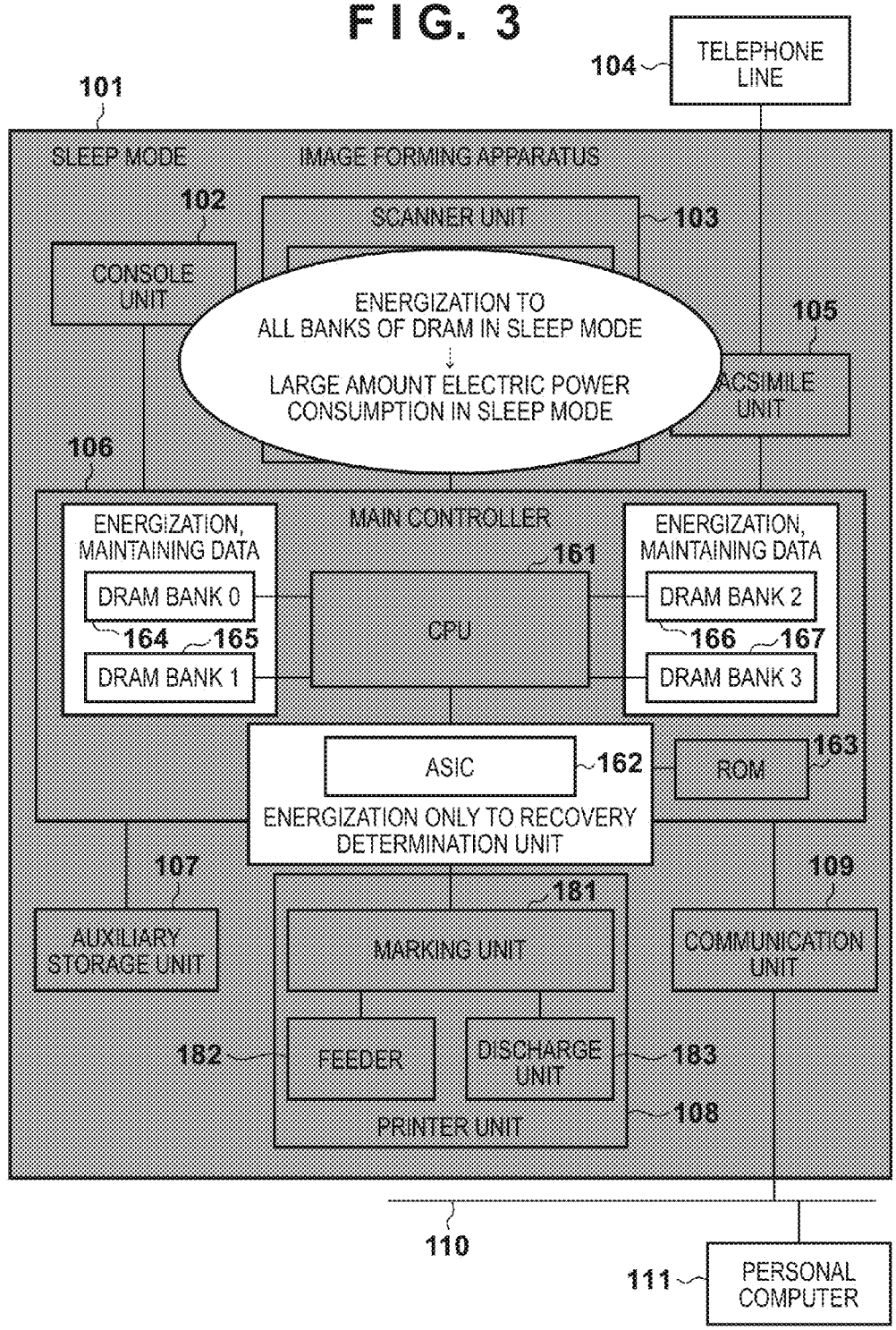
FIG. 3 is a block diagram for explaining a problem to be solved by the present invention.

FIG. 3 is a block diagram for explaining a problem to be solved by the present invention. Note that parts common to the previously described drawings are indicated with the same reference numerals. In FIG. 3, the image forming apparatus 101 is in a power saving state, and locations where the electric power supply is not performed are indicated with gray.

In the main controller 106, which is transitioned into the power saving state, the electric power is supplied to the ASIC 162 through the power supply line 250 in order to perform the electric power supply to the part for determining whether or not the condition for recovery from power saving state is satisfied independently. Also, the electric power is supplied to each of the banks 164-167 of the DRAM through the power supply lines 251-254. Hereinafter, description of the power supply unit 203 and each of the power supply lines are omitted.

In this way, an electric power consumption amount in the power saving state conventionally becomes large because a refreshing is performed for the entirety of the DRAM in the power saving state.

[First Embodiment]

Figure 4:
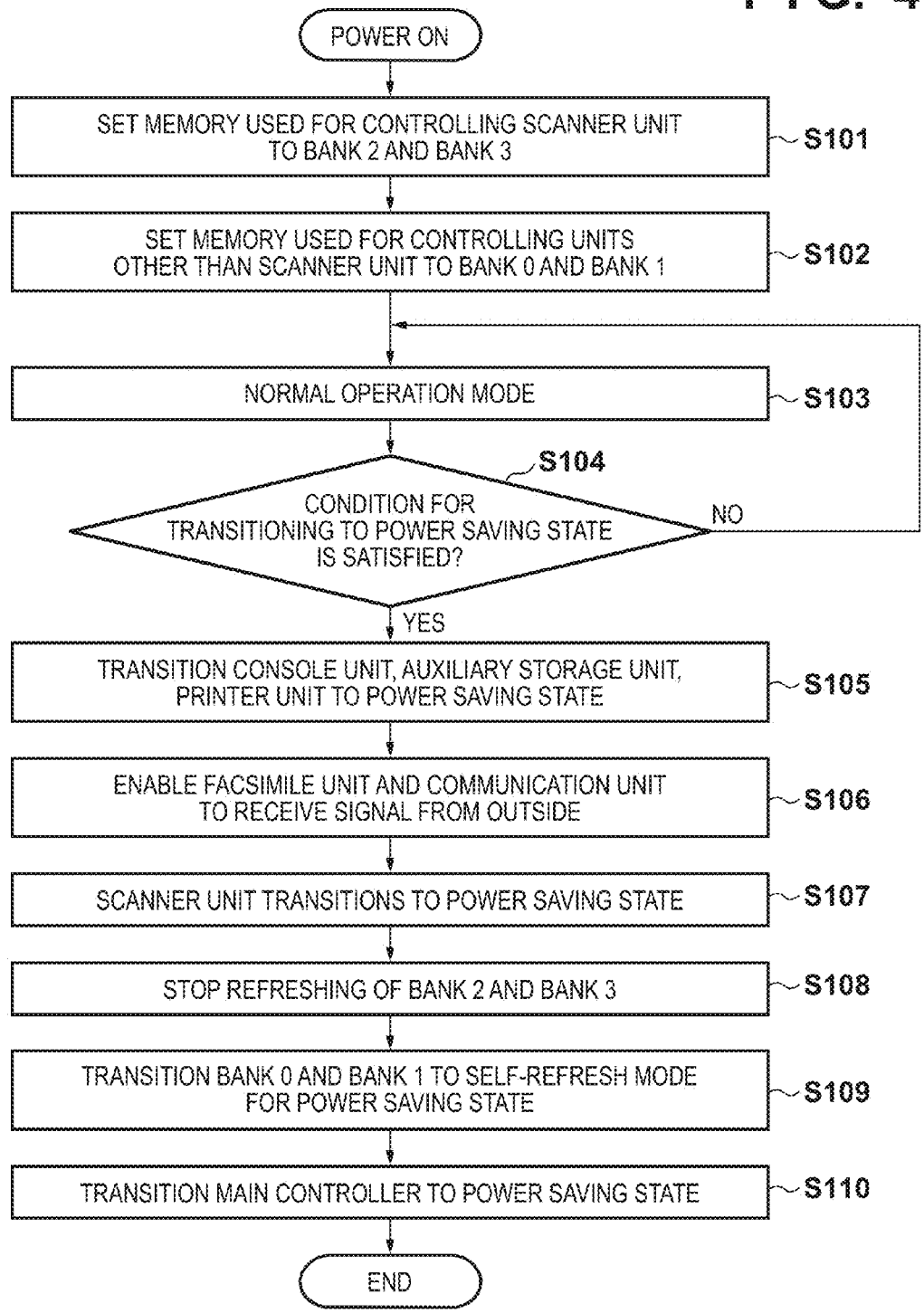
FIG. 4 is a flowchart for describing processing when the image forming apparatus according to the first embodiment transitions to a power saving state.

FIG. 4 is a flowchart for describing processing when the image forming apparatus 101 according to the first embodiment transitions to the power saving state. The program executing this processing is stored in the auxiliary storage unit 107, is loaded into the DRAM by a boot program of the ROM 163, and is executed under the control of the CPU 161.

The processing is initiated by turning on the electric power supply of the image forming apparatus 101, and firstly, the CPU 161 sets memory used for the control of the scanner unit 103 to the DRAM bank 166 (the bank 2) and the bank 167 (the bank 3) in step S101. Next, the processing proceeds to step S102 and the CPU 161 sets the memory used for control other than that of the scanner unit 103 to the DRAM bank 164 (the bank 0) and the bank 165 (the bank 1). Then the processing proceeds to step S103 and the CPU 161 initiates an operation in a normal electric power supply state (a normal operation mode). In the normal operation mode, the CPU 161 determines whether or not a condition for transitioning to the power saving state is satisfied in step S104. The conditions for transition may be an operation of an instruction for transition into sleep state by a user, or may be that a time period in which an operation instruction consecutively is not input in a standby state exceeds a predetermined interval.

In a case where the CPU 161 determines that the transition condition for transition into the power saving state is satisfied in step S104, the processing proceeds to step S105 and the electric power supply to the console unit 102, the auxiliary storage unit 107 and the printer unit 108 is stopped by the CPU 161 and the console unit 102, the auxiliary storage unit 107 and the printer unit 108 are transitioned into the power saving state. Also the CPU 161 maintains the electric power supply to the facsimile unit 105 and the communication unit 109 in step S106 in order to allow to recovery from the power saving state upon reception of a signal from outside. Next, the processing proceeds to step S107 and the CPU 161 stops the electric power supply to the scanner unit 103 and the scanner unit 103 is transitioned into the power saving state. Then, the processing proceeds to step S108 and the CPU 161 cancels a refresh setting of the DRAM bank 166 (the bank 2) and the bank 167 (the bank 3) used for controlling the scanner unit 103. With this, the refreshing of the DRAM bank 166 (the bank 2) and the DRAM bank 167 (the bank 3) is stopped. Note that configuration may be taken such that if, in step S107 and in step S108, there is a scan job input to the scanner unit 103, refreshing of the DRAM bank 166 (the bank 2) and the DRAM bank 167 (the bank 3) are stopped after a completion of the scan job in order to avoid disappearance of data of the DRAM bank 166 (the bank 2) and the DRAM bank 167 (the bank 3). Next, the processing proceeds to step S109 and the DRAM bank 164 (the bank 0) and the bank 165 (the bank 1) used for controlling anything other than the scanner unit 103 are transitioned into a self-refresh mode for the power saving mode by the CPU 161. In order to maintain data stored in the DRAM bank 164 (the bank 0) and the bank 165 (the bank 1), the refreshing is performed with a refresh cycle that is longest within a range in which the data stored in the DRAM bank 164 (the bank 0) and the bank 165 (the bank 1) is maintained. Next, the processing proceeds to step S110 and the CPU 161 stops the electric power supply to the main controller 106 and the main controller 106 is transitioned into the power saving state. In the power saving state, the electric power supply to the ASIC 162 mounted on the main controller 106 is maintained, and the ASIC 162 determines whether or not the condition for recovery from the power saving state is satisfied. The recover condition may be the operation of an instruction to recover to a normal power mode from a user, or the receipt of an activation instruction from outside to the facsimile unit 105 or the communication unit 109.

It becomes possible to stop the electric power supply to the scanner unit 103 in the image forming apparatus 101 and transition into the power saving state with the conditions where the refreshing of the DRAM associated with the scanner unit 103 is stopped. With this, it is possible to decrease the electric power consumption in the power saving state.

Figure 5:
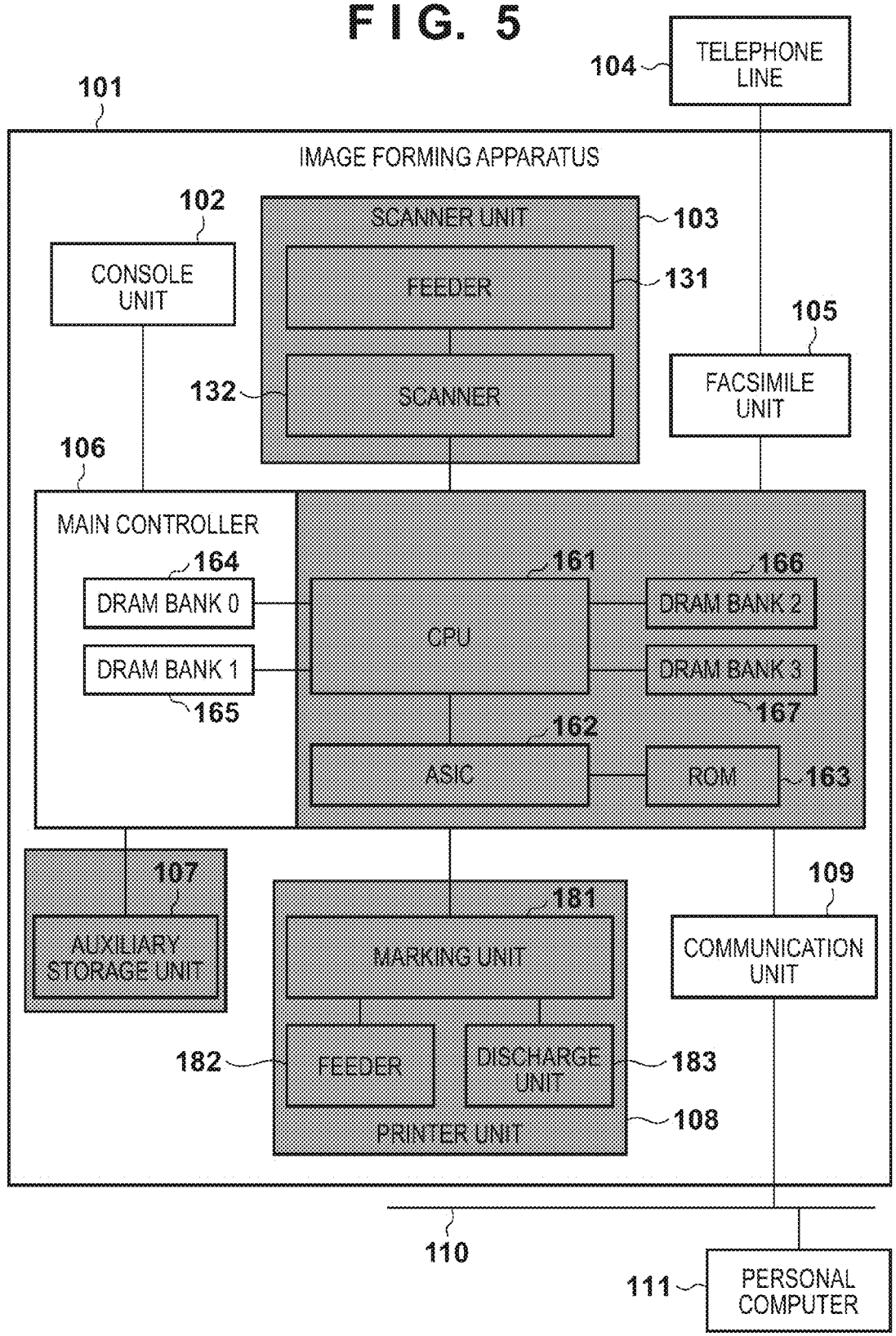
FIG. 5 depicts a view for explaining the electric power supply when the image forming apparatus according to the first embodiment has transitioned into the power saving state.

FIG. 5 depicts a view for explaining the electric power supply when an image forming apparatus 101 according to the first embodiment have transitioned into a power saving state. Note that parts common to FIG. 1 are indicated with the same reference numerals.

In FIG. 5, parts which are transitioned into the power saving state are indicated with gray. In the power saving state, the electric power supply to the console unit 102, the facsimile unit 105, the communication unit 109 and the DRAM bank 0 and the DRAM bank 1 (the self-refresh mode) is maintained and the electric power supply for parts other than these is stopped.

In this way, the electric power supply to the scanner unit 103, the printer unit 108 and the main controller 106 is stopped in the power saving state. Also, by setting the memory used for controlling the scanner unit 103 to the DRAM bank 166 (the bank 2) and the bank 167 (the bank 3), periodic energization of the bank 166 (the bank 2) and the bank 167 (the bank 3) can be omitted when the scanner unit 103 is in the power saving state. Commands required for controlling the scanner unit 103, image data read out from the scanner unit 103 or such are stored in the DRAM bank 166 (the bank 2) and the bank 167 (the bank 3).

Figure 6:
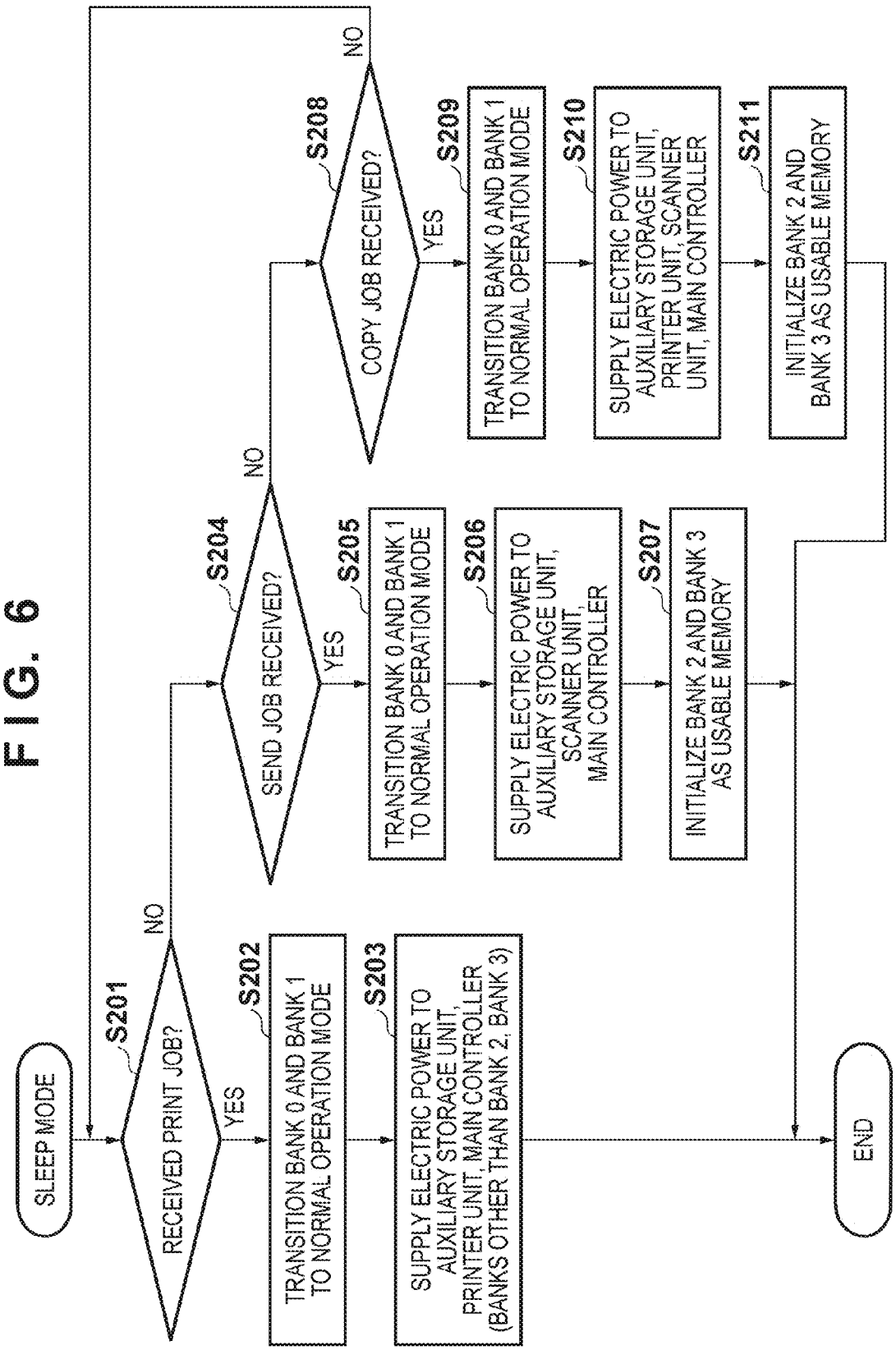
FIG. 6 is a flowchart for describing processing when the image forming apparatus according to the first embodiment recovers from a sleep mode (the power saving state).

FIG. 6 is a flowchart for describing processing when the image forming apparatus 101 according to the first embodiment recovers from the sleep mode (the power saving state). Note that a program for executing this processing is stored in the auxiliary storage unit 107, is deployed into the DRAM by a boot program of the ROM 163, and is executed under the control of the CPU 161.

The processing is executed in the power saving state, and firstly, the CPU 161 determines whether or not a print job has been received from the PC 111 via the communication unit 109 in step S201. In a case where it is determined that a print job is received in step S201, the processing proceeds to step S202 and the DRAM bank 0 and the DRAM bank 1 are transitioned from the self-refresh mode to the normal operation mode by the CPU 161. Next, the processing proceeds to step S203 and the electric power supply to the banks for the auxiliary storage unit 107, the printer unit 108 and the main controller 106 (the banks other than the DRAM bank 2 and the DRAM bank 3) is initiated by the CPU 161.

Figure 7:
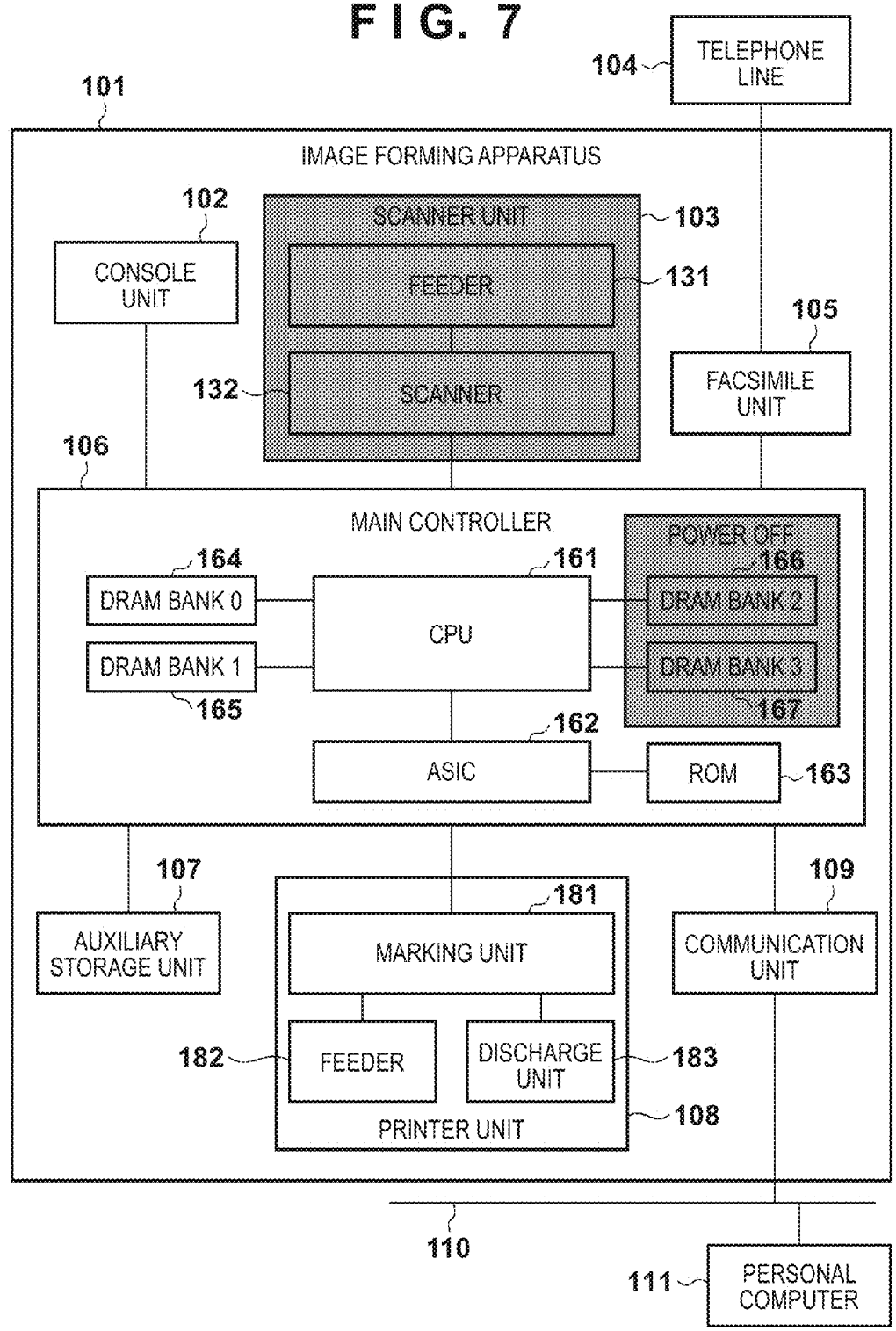
FIG. 7 depicts a view for explaining the electric power supply of the image forming apparatus when processing of step S203 in FIG. 6 has been completed.

FIG. 7 depicts a view for explaining an electric power supply of an image forming apparatus 101 performed when processing of step S203 in FIG. 6 has been completed. Here, parts common to FIG. 1 are indicated with the same reference numerals and locations which are not supplied the electric power are indicated with gray.

Here, the scanner unit 103 which is not related to the execution of the print job and the DRAM bank 166 (the bank 2) and the bank 167 (the bank 3) used for controlling the scanner unit 103 are still in the power saving state.

Meanwhile, when it is determined that the print job is not received in step S201, the processing proceeds to step S204 and the CPU 161 determines whether or not a SEND job have been received from the PC 111 via the communication unit 109. This SEND job is a job for reading an original with the scanner unit 103, and transmitting, through a network, image data of the original to a designated transmission destination. In a case where it is determined that the SEND job is received in step S204, the processing proceeds to step S205 and the DRAM bank 0 and the DRAM bank 1 are transitioned into the normal operation mode by the CPU 161. Next, the processing proceeds to step S206 and the electric power supply to the auxiliary storage unit 107, the scanner unit 103 and the main controller 106 is initiated by the CPU 161. Then the processing proceeds to step S207 and the CPU 161 initializes the DRAM bank 2 and the DRAM bank 3.

Figure 8:
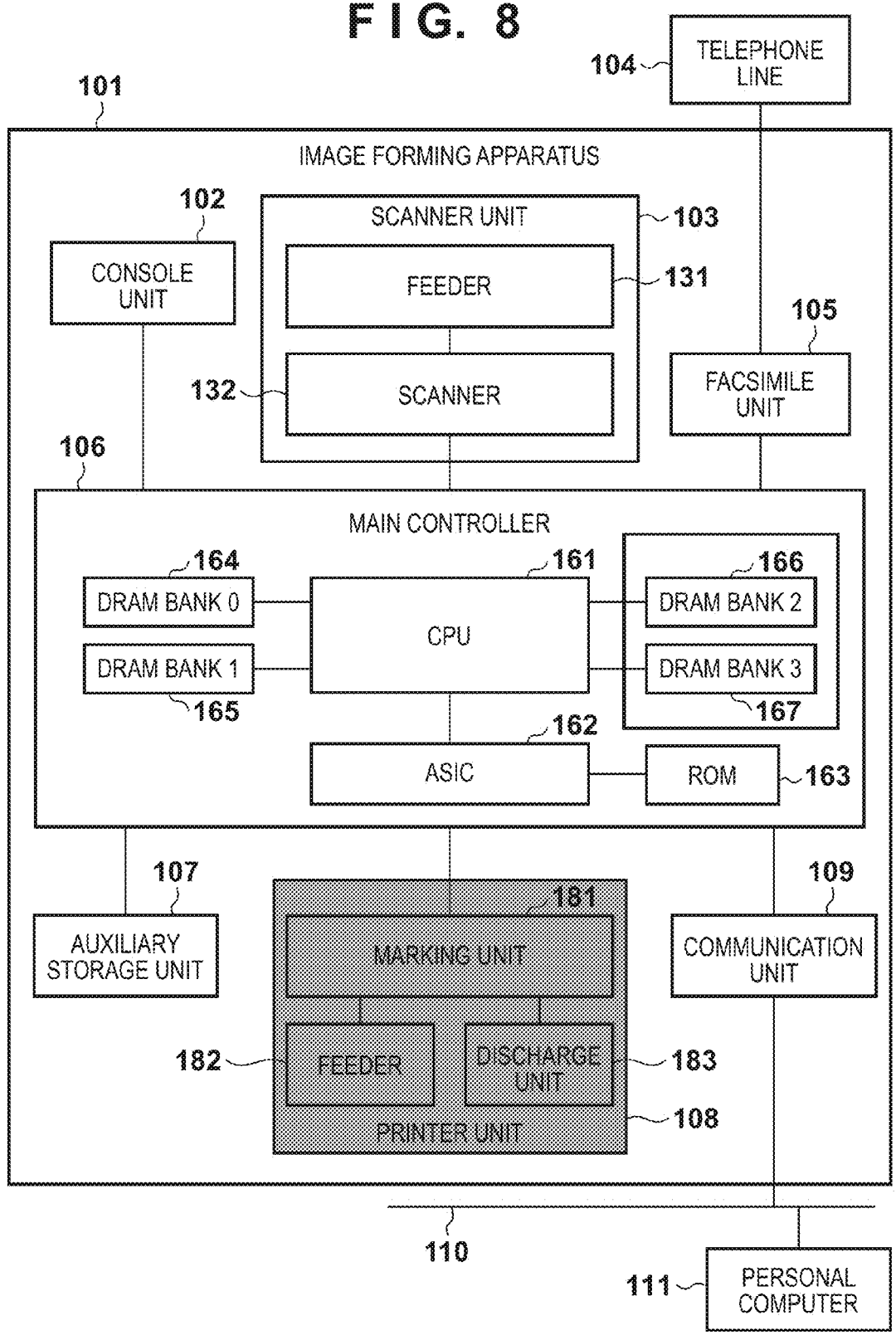
FIG. 8 depicts a view for explaining the electric power supply of the image forming apparatus when processing of step S207 in FIG. 6 has been completed.

FIG. 8 depicts a view for explaining an electric power supply of the image forming apparatus 101 when processing of step S207 in FIG. 6 has been completed. Here, parts common to FIG. 1 are indicated with the same reference numerals and locations which are not supplied the electric power are indicated with gray.

Here, the printer unit 108 which is not related to the execution of the SEND job is still in the power saving state.

Meanwhile, in a case where it is determined that the SEND job is not received in step S204, the processing proceeds to step S208 and the CPU 161 determines whether or not a copy job designated from the console unit 102 by a user has been received. In a case where it is determined that the copy job is received in step S208, the processing proceeds to step S209 and the DRAM bank 0 and the DRAM bank 1 are transitioned into the normal operation mode by the CPU 161. Next, the processing proceeds to step S210 and the electric power supply to the auxiliary storage unit 107, the scanner unit 103, the main controller 106 and the printer unit 108 is initiated by the CPU 161. Then the processing proceeds to step S211 and the DRAM bank 2 and the DRAM bank 3 are initialized in order to be useable in a normal operation by the CPU 161.

In this case, the electric power supply to the all parts of the image forming apparatus 101 is restarted and the image forming apparatus 101 recovers to the normal operation mode.

By the first embodiment, as explained above, by specifying a DRAM bank used for the scanner unit and by stopping the electric power supply to a DRAM bank used for controlling the scanner unit when stopping the electric power supply to the scanner unit and transitioning to the power saving state, refreshing of the DRAM bank is stopped. With this, it is possible to decrease the electric power consumption in the power saving state.

Also, for example, when the image forming apparatus 101 is in the power saving state, a print job is received, necessary portions for the execution of the print job are caused to recover to a normal operation mode, and portions unnecessary for the execution of the print job are left in the power saving state. Also, when a SEND job is received, necessary portions for the execution of the SEND job are caused to recover to the normal operation mode, and portions unnecessary for the execution of the SEND job are left in the power saving state. By doing this, the electric power consumption can be decreased even when recovering to an operation mode in which the apparatus is possible to execute a job.

[Second Embodiment]

Next, explanation will be given for the second embodiment of the present invention. A hardware configuration of the image forming apparatus according to the second embodiment is the same as the previously described first embodiment, so explanation is omitted. In the second embodiment, the electric power supply to the printer unit 108 is stopped in a power saving state and the electric power supply to a DRAM bank used for controlling the printer unit 108 is stopped. Explanation will be given with an example in which it is possible to reduce the electric power consumption in the power saving state with this.

Figure 9:
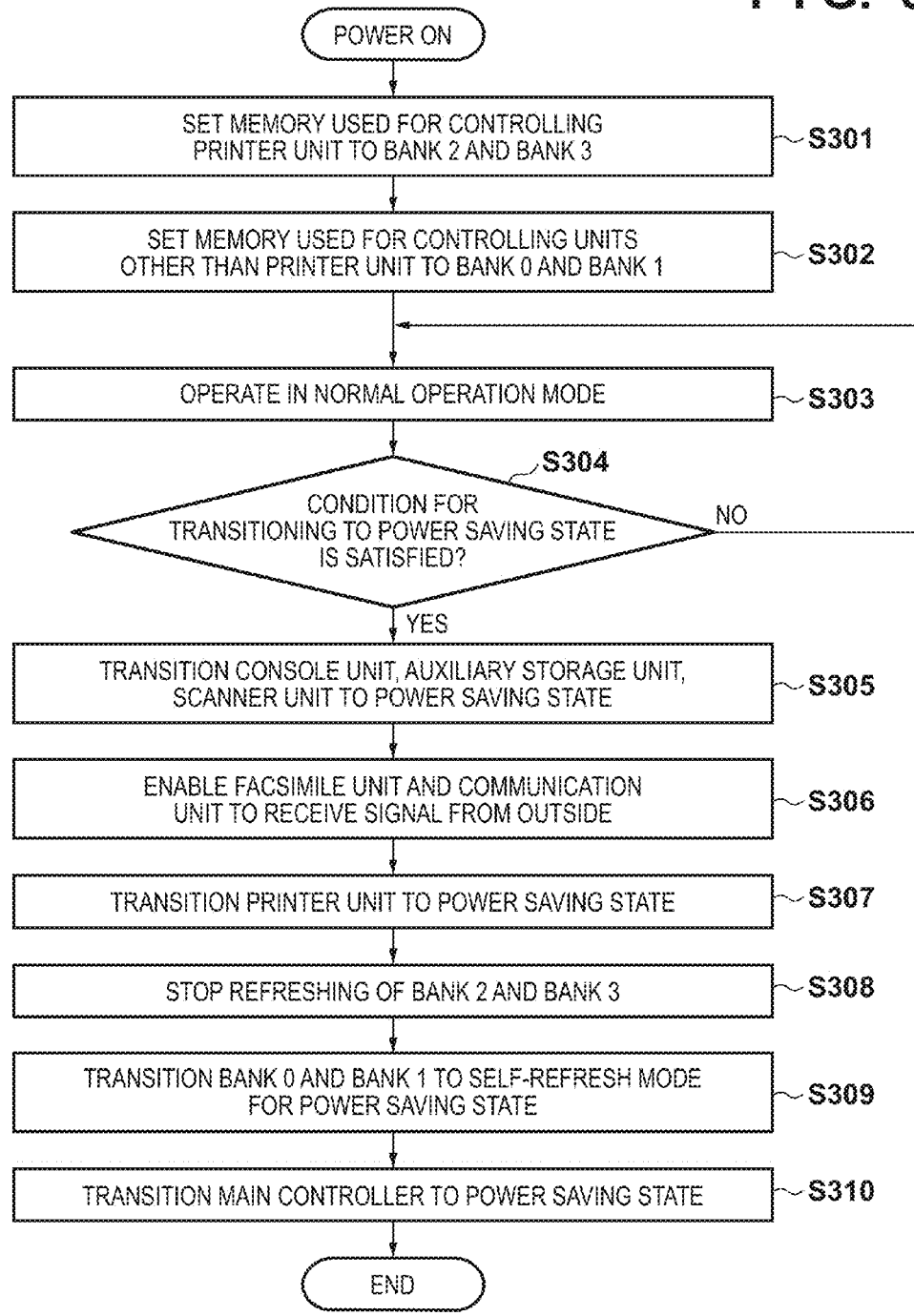
FIG. 9 is a flowchart for describing a control procedure when the image forming apparatus according to the second embodiment transitions to the power saving state.

FIG. 9 is a flowchart for describing a control procedure when the image forming apparatus 101 according to the second embodiment transitions to a power saving state. A program for executing this processing is stored in the auxiliary storage unit 107, is deployed into the DRAM by a boot program of the ROM 163, and is executed under the control of the CPU 161.

The processing is initiated by turning on the electric power supply of the apparatus, and firstly, the CPU 161 sets the memory used for controlling the printer unit 108 to the DRAM bank 166 (the bank 2) and the bank 167 (the bank 3) in step S301. Next, in step S302, the CPU 161 sets the memory used for control other than that of the printer unit 108 to the DRAM bank 164 (the bank 0) and the bank 165 (the bank 1). The processing proceeds to step S303 and the CPU 161 initiates an operation in a normal power state. Then, similarly to step S104 in FIG. 4, in the normal power state, the CPU 161 determines whether or not a transition condition for transitioning into the power saving state is satisfied in step S304. The transition condition may depend on an instruction operation by a user for transitioning to the power saving state, or may depend on the time period in which operation is not performed exceeding a predetermined interval.

In a case where the CPU 161 determines that the transition condition for transition into the power saving state is satisfied in step S304, the processing proceeds to step S305, and the CPU 161 controls the power supply unit 203 through the setup signal line 220, the electric power supply to the console unit 102, the scanner unit 103 and the auxiliary storage unit 107 is stopped by the CPU 161, and the console unit 102, the scanner unit 103 and the auxiliary storage unit 107 are transitioned into the power saving state. Next, the processing proceeds to step S306 and the CPU 161 maintains the electric power supply to the facsimile unit 105 and the communication unit 109 in order to allow recovery from the power saving state upon receipt of a signal from outside.

Next, the processing proceeds to step S307 and the electric power supply to the printer unit 108 via the power supply line 244 is stopped by the CPU 161 and the printer unit 108 is transitioned into the power saving state. Then, the processing proceeds to step S308 and the CPU 161 cancels a refresh setting of the DRAM bank 166 (the bank 2) and the bank 167 (the bank 3) used for controlling the printer unit 108 and stops the refreshing of the DRAM bank 2 and the DRAM bank 3. Note, in step S307 and in step S308, in order to avoid a print job currently input to the printer unit 108 being suspended due to data output to the printer unit 108 not being maintained in the DRAM banks 166 and 167, the CPU 161 may stop the refreshing after waiting for the completion of the print job.

Next, the processing proceeds to step S309 and the DRAM bank 164 (the bank 0) and the bank 165 (the bank 1) are transitioned into the self-refresh mode in the power saving state where the refresh cycle becomes longest within a range in which data stored in the DRAM bank 164 (the bank 0) and the bank 165 (the bank 1) is maintained and refreshing is performed by the CPU 161. With this, the data, which is used for controlling units other than the printer unit 108 and maintained in the DRAM bank 164 (the bank 0) and the bank 165 (the bank 1), can be maintained. Next, the processing proceeds to step S310, the electric power supply to the main controller 106 is stopped and the main controller 106 is caused to transition into the power saving state.

With this, transition into the power saving state can be made with a condition where the electric power supply to the printer unit 108 in the image forming apparatus 101 is stopped.

Note, restoring processing from the power saving state is as explained with reference to the flowchart of FIG. 6 which was previously described.

By the second embodiment, as explained above, the refreshing of the banks in the DRAM used for controlling the printer unit is stopped where the banks of the DRAM used by the printer unit are specified and the printer unit is transitioned into the power saving state. With this, it is possible to reduce the electric power consumption in the power saving state further.

[Third Embodiment]

Next, explanation will be given for the third embodiment of the present invention. Note that a hardware configuration of the image forming apparatus according to the third embodiment is the same as the previously described first embodiment, so explanation is omitted. In the third embodiment, the electric power supply to the scanner unit 103 and the printer unit 108 is stopped and the electric power supply to the DRAM bank used for controlling the scanner unit 103 and the printer unit 108 is stopped in the power saving state. Explanation will be given with an example in which it is possible to reduce the electric power consumption in the power saving state with this.

Figure 10:
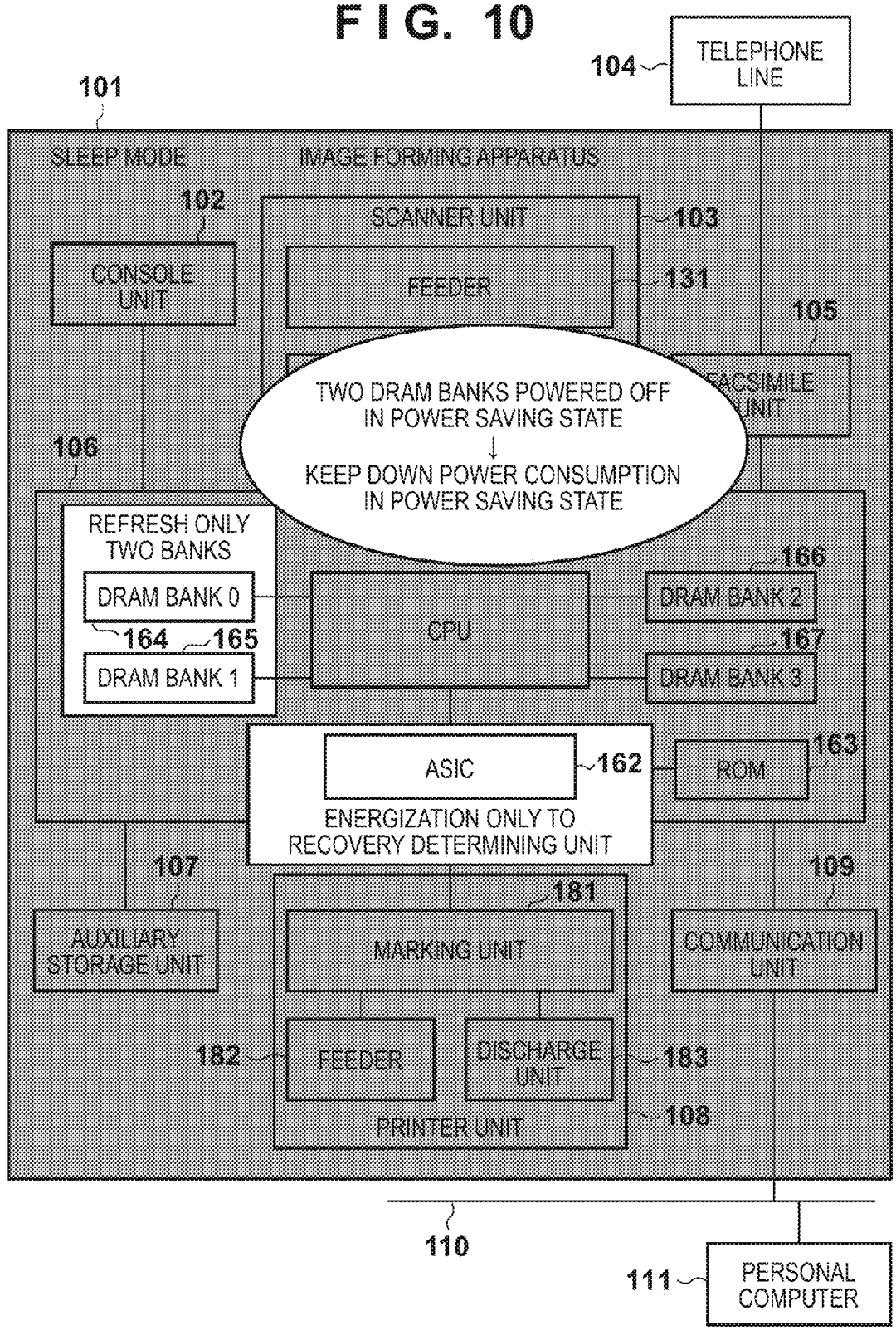
FIG. 10 depicts a view for explaining a condition of performing power saving control of a portion of a DRAM in association with a scanner unit and a printer unit for the image forming apparatus according to the third embodiment.

FIG. 10 depicts a view for explaining a condition of performing power saving control of a portion of the DRAM in association with the scanner unit 103 and the printer unit 108 in the image forming apparatus 101 according to the third embodiment. Here, parts common to FIG. 1 are indicated with the same reference numerals and locations which are not supplied the electric power are indicated with gray.

Here, the memory used for controlling the scanner unit 103 and the printer unit 108 is the DRAM bank 166 (the bank 2) and the bank 167 (the bank 3). With this, the refreshing of the bank 166 (the bank 2) and the bank 167 (the bank 3) can be stopped in a condition in which the scanner unit 103 and the printer unit 108 are in the power saving state.

Figure 11:
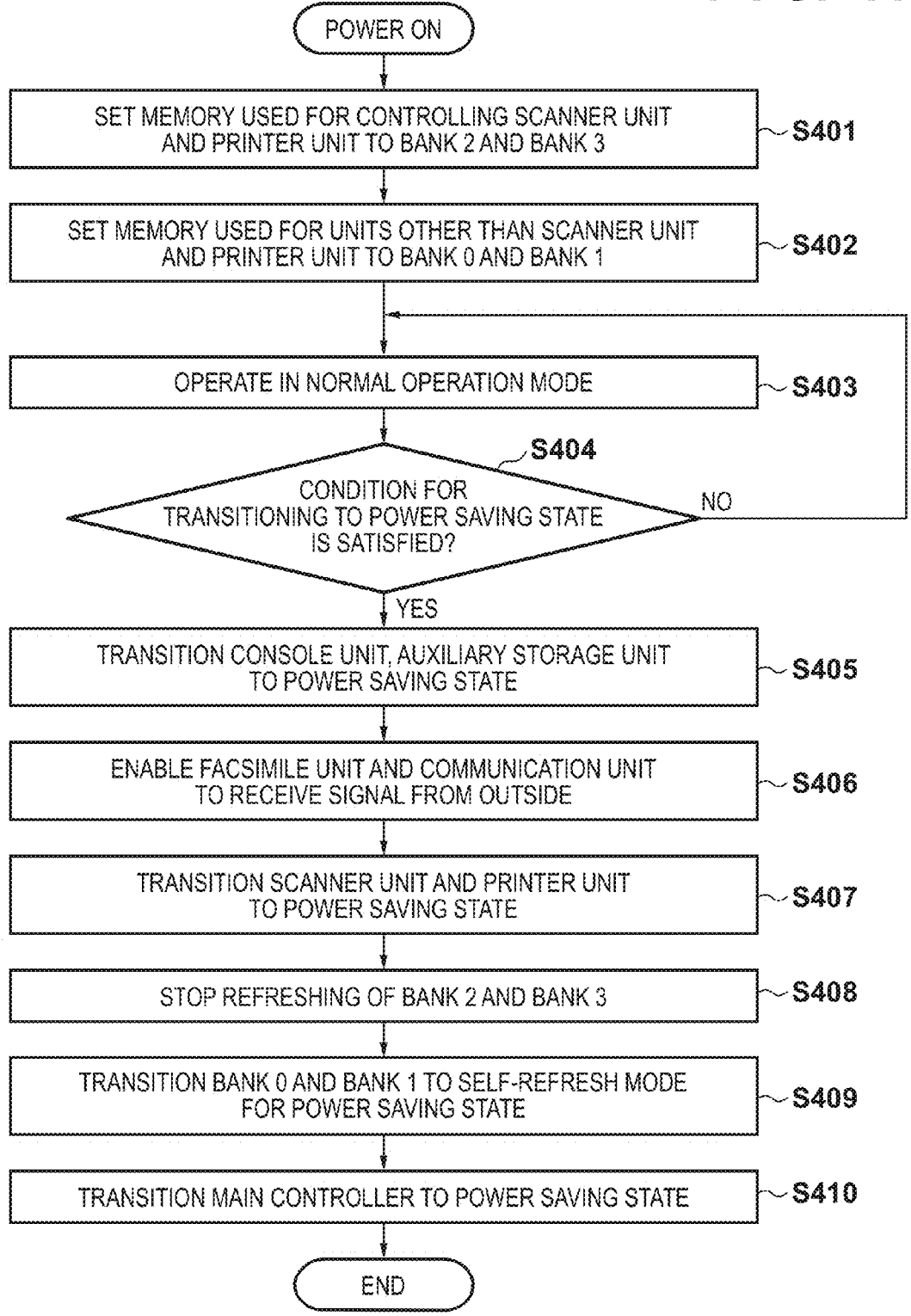
FIG. 11 is a flowchart for describing a control procedure when the image forming apparatus according to the third embodiment transitions to the power saving state.

FIG. 11 is a flowchart for describing a control procedure when the image forming apparatus 101 according to the third embodiment transitions to the power saving state. Note, a program for executing this processing is stored in an auxiliary storage unit 107, is deployed into the DRAM by a boot program of the ROM 163, and is executed under the control of the CPU 161.

The process is initiated when the electric power supply of the apparatus is turned on, and first, the memory used for controlling the scanner unit 103 and the printer unit 108 is set to the DRAM bank 166 (the bank 2) and the bank 167 (the bank 3) by the CPU 161 in step S401. Next, the memory used for controlling units other than the scanner unit 103 and the printer unit 108 is set to the DRAM bank 164 (the bank 0) and the bank 165 (the bank 1) by the CPU 161 in step S402, and operation in the normal power mode is initiated in step S403.

Next, the CPU 161 determines whether or not the transition condition for transitioning into the power saving state is satisfied in step S404. The determination of whether or not the transition condition is satisfied may depend on an operation for instructing transition into the power saving state being made by a user, or may depend upon a time period in which operation is not performed being a predetermined time period. When it is determined that the transition condition to the power saving state is satisfied in step S404, the processing proceeds to step S405, the CPU 161 stops the electric power supply to the console unit 102 and the auxiliary storage unit 107, and causes them to transition into the power saving state. Also the CPU 161 maintains the electric power supply to the facsimile unit 105 and the communication unit 109 in step S406 in order to allow recovery from the power saving state upon receipt of a signal from outside. Next, the processing proceeds to step S407 and the electric power supply to the scanner unit 103 and the printer unit 108 is stopped and these are caused to transition into the power saving state by the CPU 161. Next, the processing proceeds to step S408 and the refresh setting of the DRAM bank 166 (the bank 2) and the bank 167 (the bank 3) used for controlling the scanner unit 103 and the printer unit 108 is cancelled and refreshing is stopped by the CPU 161. Note, in step S407 and in step S408, a scan job by the scanner unit 103 is suspended or a print job by the printer unit 108 is suspended because the data of the DRAM bank 2 and the DRAM bank 3 disappears. In order to prevent this, configuration may be taken such that the refreshing of the memory bank is stopped after waiting for the completion of the scan job and the print job.

Next, the processing proceeds to step S409 and transition into the self-refreshing with a refresh cycle being longest within a range in which data stored in the DRAM bank 164 (the bank 0) and the bank 165 (the bank 1) is maintained is made in order to maintain data of the DRAM bank 164 (the bank 0) and the bank 165 (the bank 1) used for controlling units other than the scanner unit 103 and the printer unit 108 by the CPU 161. Then, the processing proceeds to step S410, the electric power supply to the main controller 106 is stopped and the main controller 106 is caused to transition into the power saving state.

Note, restoring processing from the power saving state is as explained with reference to the flowchart of FIG. 6 the previously described.

As explained above, by virtue of the third embodiment, when banks of DRAM are allocated to each of the scanner unit and the printer unit, and then the scanner unit and the printer unit are caused to transition into the power saving state, by stopping the refreshing of the banks of the DRAM used for controlling the scanner unit and the printer unit, the electric power consumption amount in the power saving state can be reduced furthermore.

[Fourth Embodiment]

Next, explanation will be given for the fourth embodiment of the present invention. Note that a hardware configuration of the image forming apparatus according to the fourth embodiment is the same as the previously described first embodiment, so explanation is omitted.

In the embodiments previously described, the example of reducing the electric power consumption amount in the power saving state, by associating DRAM banks with the control of the scanner unit 103 and the printer unit 108 and stopping the memory refreshing of the associated memory banks, is explained.

In contrast to this, in the fourth embodiment, areas of the DRAM, not the bank, are controlled having associated the areas with control of the scanner unit 103 and the printer unit 108 in an apparatus which manages a memory with an area called an interleave in order to improve an access speed of the DRAM. Here, the areas indicate segment portions of each bank of the DRAM. The interleave is a technique for improving the access speed to the memory by for example accessing an area 0 which is a portion of the DRAM bank 0, and an area 0 which is a portion of the same size of the bank 1 alternatingly.

Figure 12:
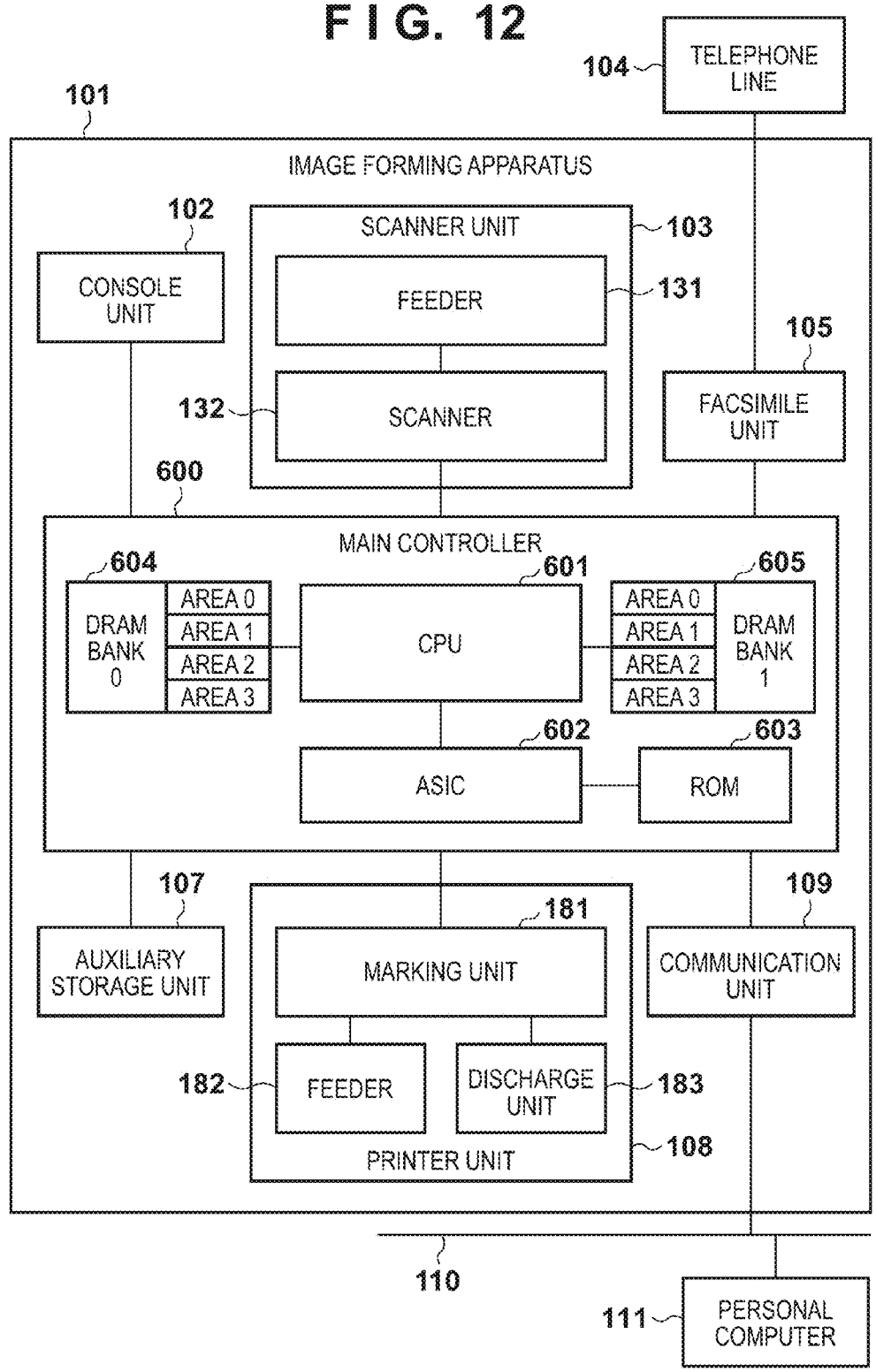
FIG. 12 is a block diagram for explaining a configuration of the image forming apparatus according to the fourth embodiment.

FIG. 12 is a block diagram for explaining a configuration of the image forming apparatus 101 according to the fourth embodiment, an parts common to previously described embodiments are indicated with the same reference numerals, and their explanation will be omitted.

In FIG. 12, a main controller 600 comprises a CPU 601, a DRAM bank 604 (the bank 0), 605 (the bank 1), an ASIC 602 and a ROM 603. Note, the ASIC 602 and the ROM 603 are basically the same as the ASIC 162 and the ROM 163 according to the previously described first embodiment. The DRAM bank 604 (the bank 0) includes areas 0-3, and the DRAM bank 605 (the bank 1) also includes areas 0-3.

Figure 13:
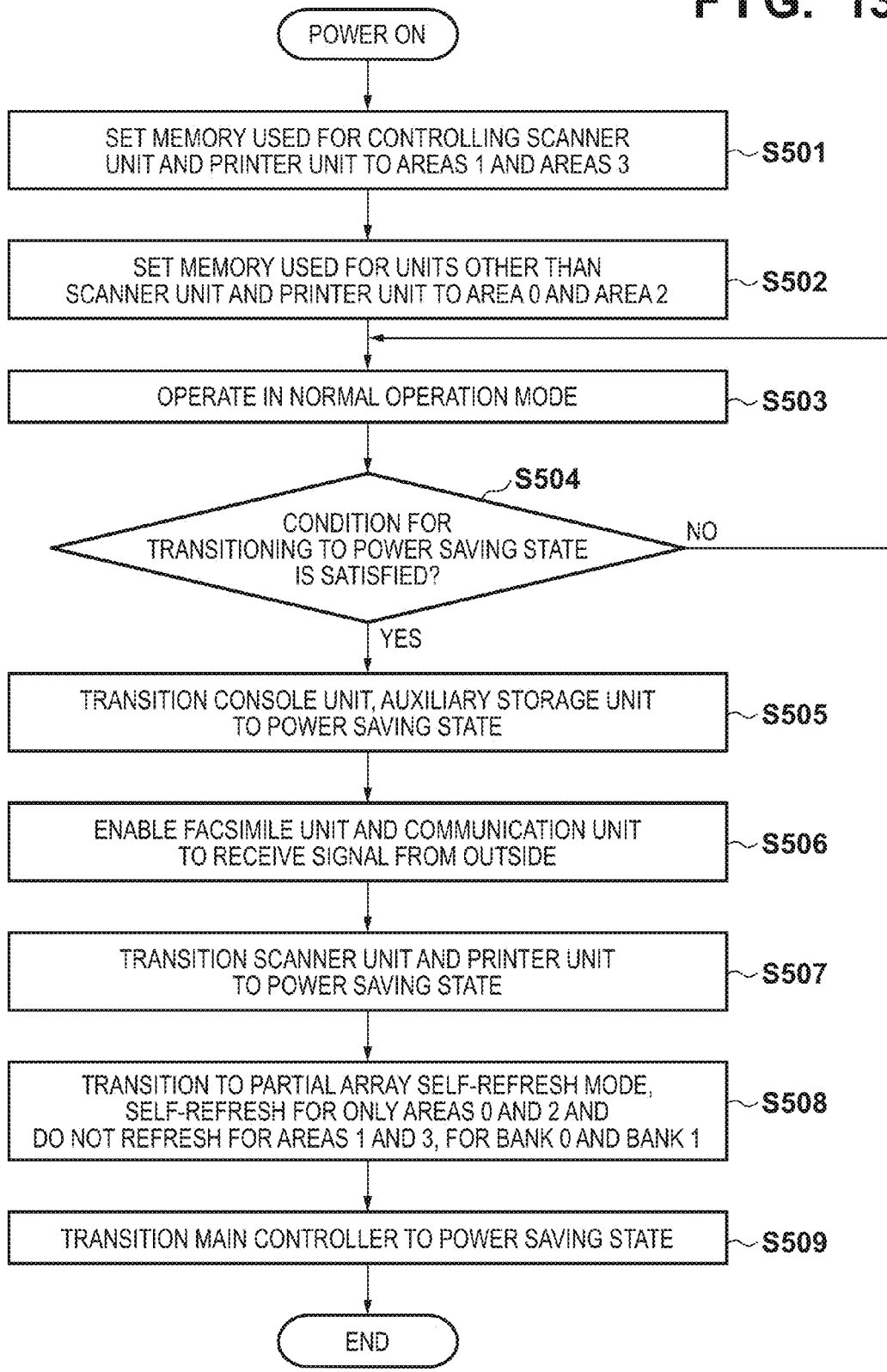
FIG. 13 is a flowchart for describing a control procedure when the image forming apparatus according to the fourth embodiment transitions to the power saving state.

FIG. 13 is a flowchart for describing a control procedure when the image forming apparatus 101 according to the fourth embodiment transitions to the power saving state. Note that a program for executing this processing is stored in the auxiliary storage unit 107, is deployed into the DRAM by a boot program of the ROM 603, and is executed under the control of the CPU 601.

The processing is initiated by turning on the electric power supply of the image forming apparatus 101. First, in step S501, a memory used for controlling the scanner unit 103 and the printer unit 108 is set to the area 1 and the area 3 of the DRAM bank 604 (the bank 0) and the area 1 and the area 3 of the DRAM bank 605 (the bank 1) by the CPU 601. Next, the processing proceeds to step S502 and a memory used for controlling units other than the scanner unit 103 and the printer unit 108 is set to the area 0 and the area 2 of the DRAM bank 604 (the bank 0), and the area 0 and the area 2 of the DRAM bank 605 (the bank 1) by the CPU 601. Then in step S503, operation in the normal power state (normal operation mode) is initiated.

Next, the processing proceeds to step S504, while performing an interleave operation with the DRAM bank 604 (the bank 0) and the bank 605 (the bank 1), the CPU 601 determines whether or not a transition condition for transiting into the power saving state is satisfied. The determination of whether or not the transition condition is satisfied may depend on an operation of an instruction for transitioning to the power saving state being made by a user, or may be determined based on a time period in which operation is not made being predetermined time period. Here when it is determined that the transition condition for transition into the power saving state is satisfied, the processing proceeds to step S505 and the CPU 601 stops the electric power supply to the console unit 102 and the auxiliary storage unit 107 and causes transition into the power saving state. Next, the processing proceeds to step S506 and the CPU 601 maintains the electric power supply to the facsimile unit 105 and the communication unit 109 in order to allow recovery from the power saving state upon reception of a signal from outside. Next, the processing proceeds to step S507 and the electric power supply to the scanner unit 103 and the printer unit 108 is stopped and these are caused to transition into the power saving state by the CPU 601. And in step S508, the CPU 601 transitions to a partial array self-refresh mode. Here, in both of the DRAM bank 604 (the bank 0) and the bank 605 (the bank 1), the self-refreshing is performed for only the area 0 and the area 2, and the refresh operation is not performed for the area 1 and the area 3. Next, the processing proceeds to step S509 and the CPU 601 stops the electric power supply to the main controller 600 and the main controller 600 is caused to transition into the power saving state. Note, in step S507 and in step S508, data of the area 1 and the area 3 is not maintained. So, in order to prevent a scan job of the scanner unit 103 being interrupted or prevent a print job of the printer unit 108 being interrupted, the refreshing of the area 1 and the area 3 may be stopped after waiting for a completion of the scan job and the print job.

And the processing for operation in the normal operation mode after recovering from the power saving state is performed similarly to the flowchart in the previously described FIG. 6. However, in such a case, when the transition into the normal operation mode of the DRAM bank 0 and the bank 1 is made, the CPU 601 causes the transition into the normal operation mode by cancelling the partial array self-refresh mode of the DRAM bank 604 (the bank 0) and the bank 605 (the bank 1). Also, the CPU 601 initializes the area 1 and the area 3 of the DRAM bank 604 (the bank 0) and the area 1 and the area 3 of the bank 605 (the bank 1) used for controlling the scanner unit 103 and the printer unit 108. With this, the areas of these DRAMs can be used for controlling the scanner unit 103 and the printer unit 108.

As explained above, according to the fourth embodiment, by specifying areas of a DRAM associated with the scanner unit and the printer unit, and stopping self-refreshing of the areas of the DRAM associated with the scanner unit and the printer unit in the power saving state when a transition into a power saving state is made, the electric power consumption amount in the power saving state can be reduced further.

Figure 14:
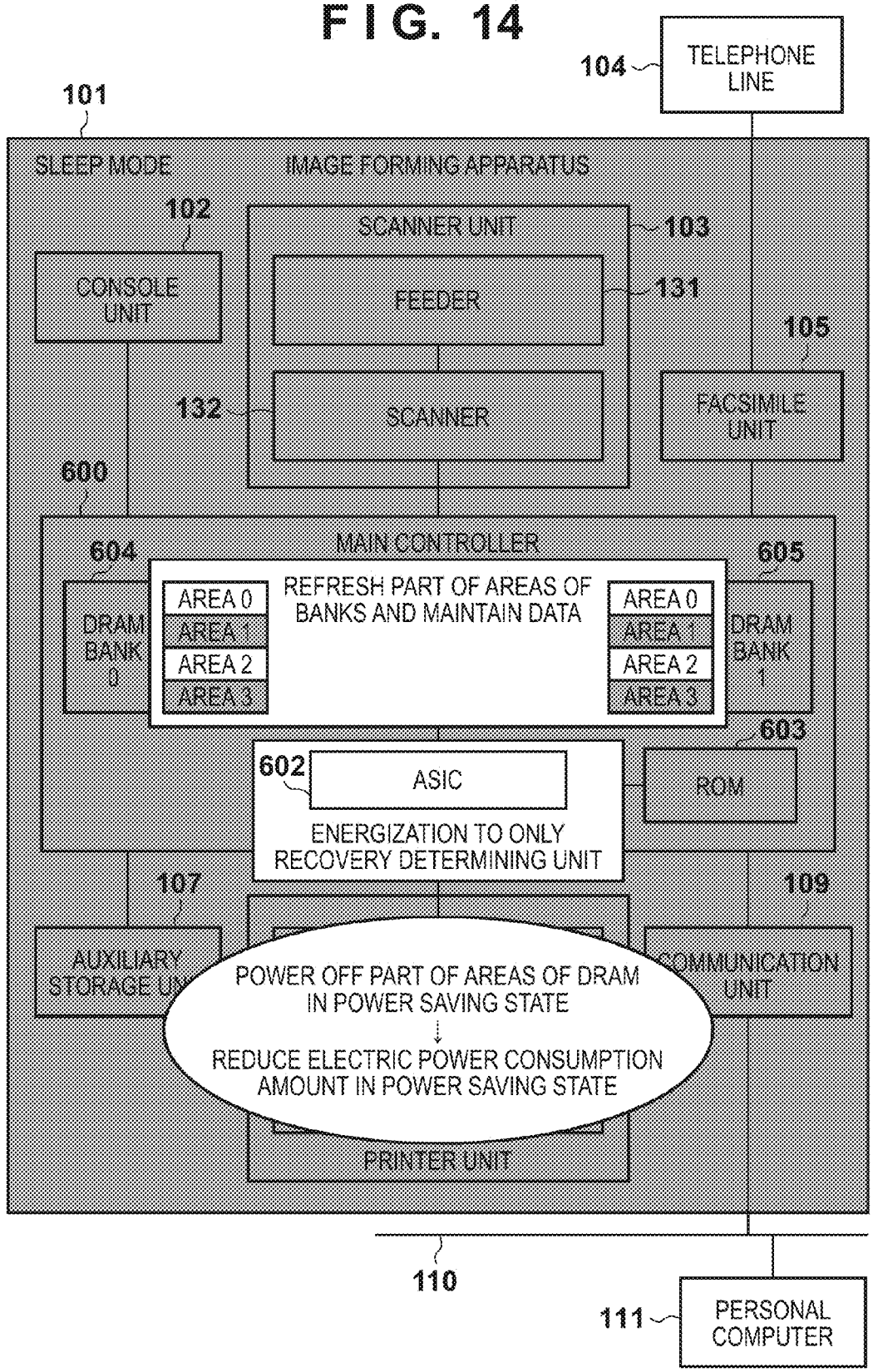
FIG. 14 is a block diagram for explaining an effect of the fourth embodiment.

FIG. 14 is a block diagram for explaining effects of the fourth embodiment. Parts common to FIG. 12 are indicated with the same reference numerals, and their explanation will be omitted. And in FIG. 14, locations which are not supplied the electric power are indicated with gray.

In FIG. 14, the areas 0 and 2 of the DRAM bank 604 (the bank 0), the areas 0 and 2 of the bank 605 (the bank 1) and the ASIC 602 which determines whether or not a condition for recovering from the power saving state is satisfied are energized in the power saving state, and the electric power supply to other units is disconnected or is reduced. With this, it is possible to further decrease the electric power consumption in the power saving state.

[Fifth Embodiment]

Next, explanation will be given for the fifth embodiment of the present invention. A hardware configuration of the image forming apparatus according to the fifth embodiment is the same as the previously described first embodiment, so explanation is omitted. While in the embodiments previously described, explanation was given in a case where there is a single CPU of a main controller, in the fifth embodiment, explanation will be given with an example of comprising two CPUs of a main controller.

In recent years, an embodiment where each of a plurality of CPUs has a memory controller, referred to as NUMA (Non-Uniform Memory Access) has prevailed. In a NUMA configuration, in order to improve an access speed to the DRAM, an embodiment where an OS (operating system) distributes usage of memory for each group of processors is in general adopted. In the NUMA configuration, it is possible to control the DRAM banks in association with controlling the scanner unit 103 and the printer unit 108 by associating control processing of the scanner unit 103 and the printer unit 108 with a processor group.

Figure 15:
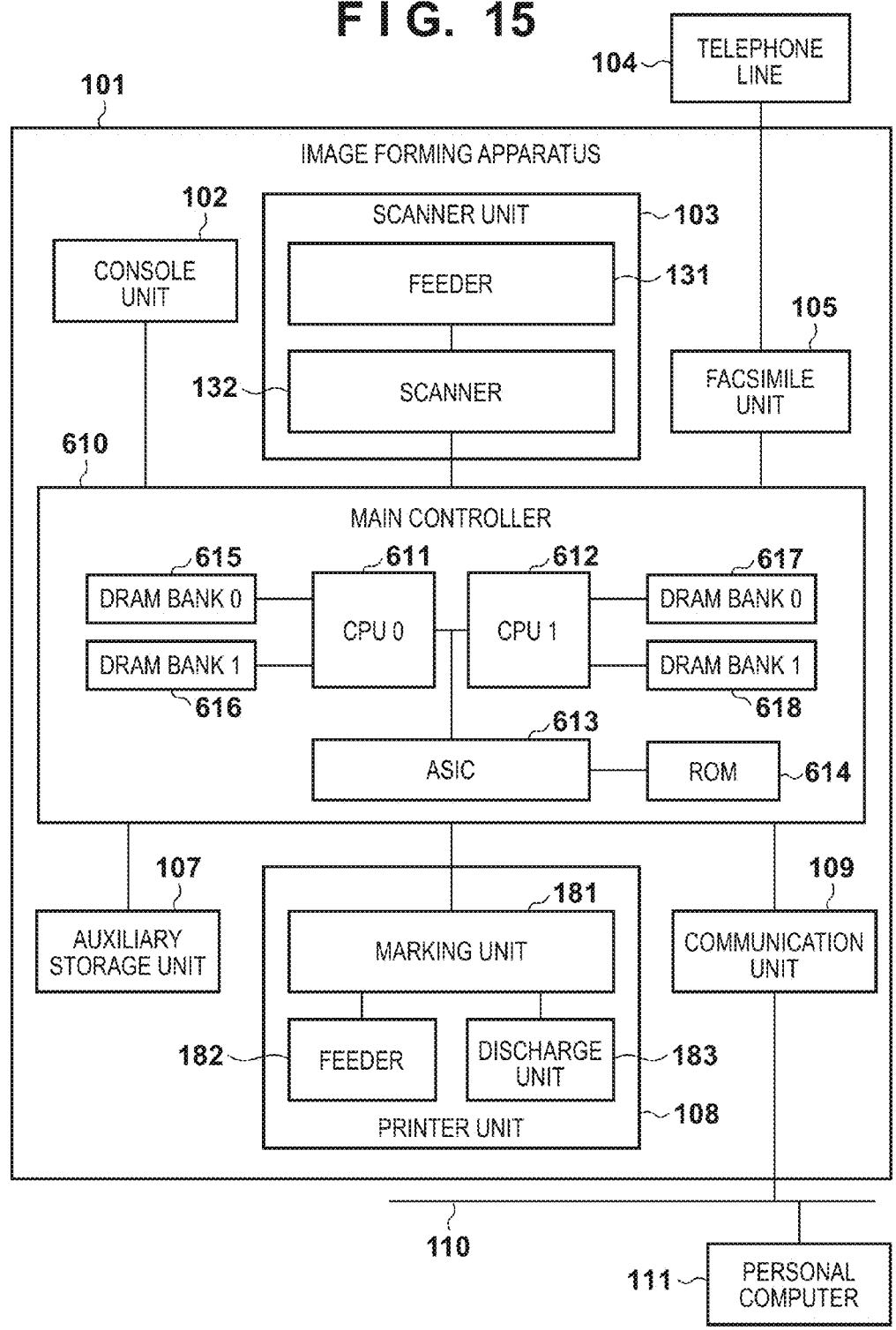
FIG. 15 is a block diagram for explaining a configuration of the image forming apparatus according to the fifth embodiment.

FIG. 15 is a block diagram explaining a configuration of the image forming apparatus 101 according to the fifth embodiment, and the points of difference from the previously described first embodiment are that there are two CPUs in the main controller 610 and that the banks of DRAM are allocated to the CPUs respectively. Note, an ASIC 613 and a ROM 614 are basically the same with the ASIC 162 and the ROM 163 according to the previously described first embodiment.

In FIG. 15, for example processing of a processor group of the CPU 611 (CPU 0) is performed using the DRAM bank 617 (the bank 0) or the bank 618 (the bank 1) connected to the memory controller of the CPU 612 (the CPU 1) as a memory. In such a case, receiving and transmitting of data between the CPU 611 and the CPU 612 are required. For this reason, the processing becomes slow compared to a case where the DRAM bank 615 (the bank 0) or the bank 616 (the bank 1) connected to the CPU 611 is used. For this reason, in general the OS, is generally loaded into the DRAM bank 615 (the bank 0) or the bank 616 (the bank 1) connected to the CPU 611 by the processor group of the CPU 611. Also, in general, the OS is loaded into the DRAM bank 617 (the bank 0) or the bank 618 (the bank 1) connected to the CPU 612 by the processor group of the CPU 612. Here, the reason why the CPU 611 and the CPU 612 are described as a "processor group" is because, even if there is physically one CPU die, there are cases in which a plurality of logic CPU cores are mounted in one CPU die internally.

Figure 16:
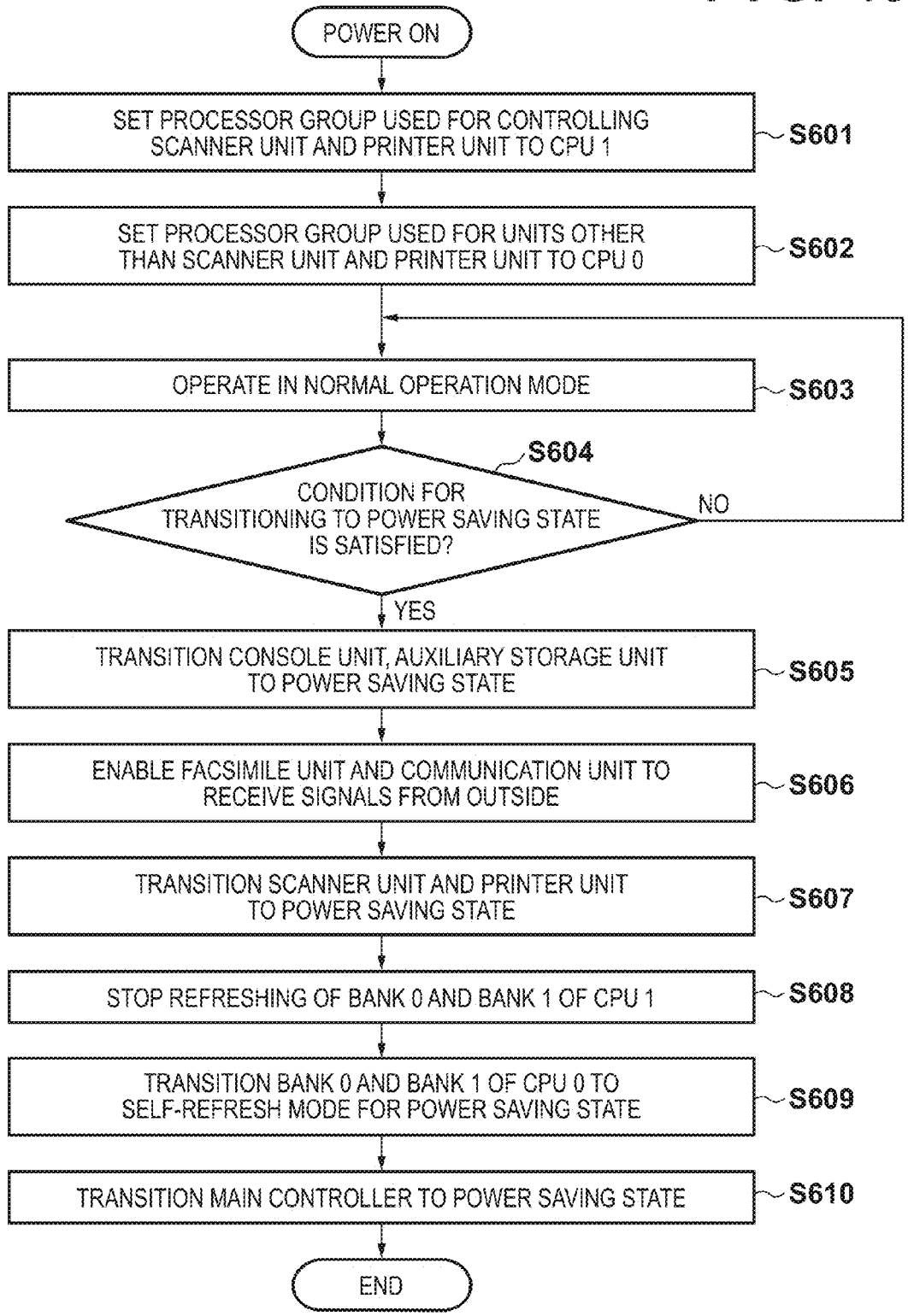
FIG. 16 is a flowchart for describing a control procedure when the image forming apparatus according to the fifth embodiment transitions to the power saving state.

FIG. 16 is a flowchart for describing a control procedure when the image forming apparatus 101 according to the fifth embodiment transitions to a power saving state. Note, a program for executing this processing is stored in the auxiliary storage unit 107, is deployed into the DRAM by a boot program of the ROM 614, and is executed under the control of the CPU 611.

The process is initiated when the electric power supply of the image forming apparatus 101 is turned on, and first, in step S601, a processor group used for controlling the scanner unit 103 and the printer unit 108 is set to the processor group of the CPU 612 (CPU 1) by the CPU 611 upon initialization. Next, the processing proceeds to step S602 and the processor group used for controlling units other than the scanner unit 103 and the printer unit 108 is set to the processor group of the CPU 611 (CPU 0) by the CPU 611. The processing proceeds to step S603 and the CPU 611 initiates operation in a normal operation mode. Next, the processing proceeds to step S604 and the CPU 611 determines whether or not the transition condition for transitioning into the power saving state is satisfied. The determination of whether or not the transition condition is satisfied may be based on an instruction operation for transitioning into the power saving state being made by the user, or may be determined based on whether or not a time period in which operation is not performed became a predetermined time period.

When it is determined that the transition condition for transition into the power saving state is satisfied in step S604, the processing proceeds to step S605, and the CPU 611 stops the electric power supply to the console unit 102 and the auxiliary storage unit 107, and causes a transition into the power saving state. Next, the processing proceeds to step S606 and the CPU 611 maintains the electric power supply to the facsimile unit 105 and the communication unit 109 to enable reception of an activation signal from outside. Next, the processing proceeds to step S607 and the CPU 611 stops the electric power supply to the scanner unit 103 and the printer unit 108 and causes these to transition into the power saving state. Here, the CPU 611 stops the refreshing of the DRAM bank 617 (the bank 0) and the bank 618 (the bank 1) connected to the CPU 612 used for controlling the scanner unit 103 and the printer unit 108 by setting of the processor group. Note, in step S607 and in step S608, in order to prevent a scan job by the scanner unit 103 from being interrupted or a print job by the printer unit 108 from being interrupted by the data of the DRAM being deleted, the refreshing is stopped after waiting for a completion of the job.

Next, the processing proceeds to step S609 and the CPU 611 maintains the refreshing of the DRAM bank 615 (the bank 0) and the bank 616 (the bank 1) connected to the CPU 611 used for controlling units other than the scanner unit 103 and the printer unit 108 by the setting of the processor group. Here, transition into a self-refresh mode for power saving of a refresh cycle in which an energization interval is made to be longest within a range in which data stored in the DRAM bank 615 (the bank 0) and the bank 616 (the bank 1) is maintained is caused. Next, the processing proceeds to step S610, the electric power supply to the main controller 610 is stopped and the CPU 611 also transitions into the power saving state.

Next, the processing of an operation in the normal operation mode after returning from the power saving state is performed similarly to the flowchart in the previously described FIG. 6.

Note, in returning to the normal operation mode, the DRAM bank 615 (the bank 0) and the bank 616 (the bank 1) connected to the CPU 611 used for controlling units other than the scanner unit 103 and the printer unit 108 are caused to transition into the normal operation mode. Also, the electric power supply to the console unit 102, the auxiliary storage unit 107, the facsimile unit 105 and the communication unit 109 is restarted and caused them to recover to the normal operating mode.

Also, when activating the scanner unit 103 or the printer unit 108, the CPU 611 initializes the DRAM bank 617 (the bank 0) and the bank 618 (the bank 1) connected to the CPU 612 used for controlling the scanner unit 103 and the printer unit 108. Also, the electric power supply to the scanner unit 103 and the printer unit 108 are restarted and caused to transition into the normal operating mode.

Figure 17:
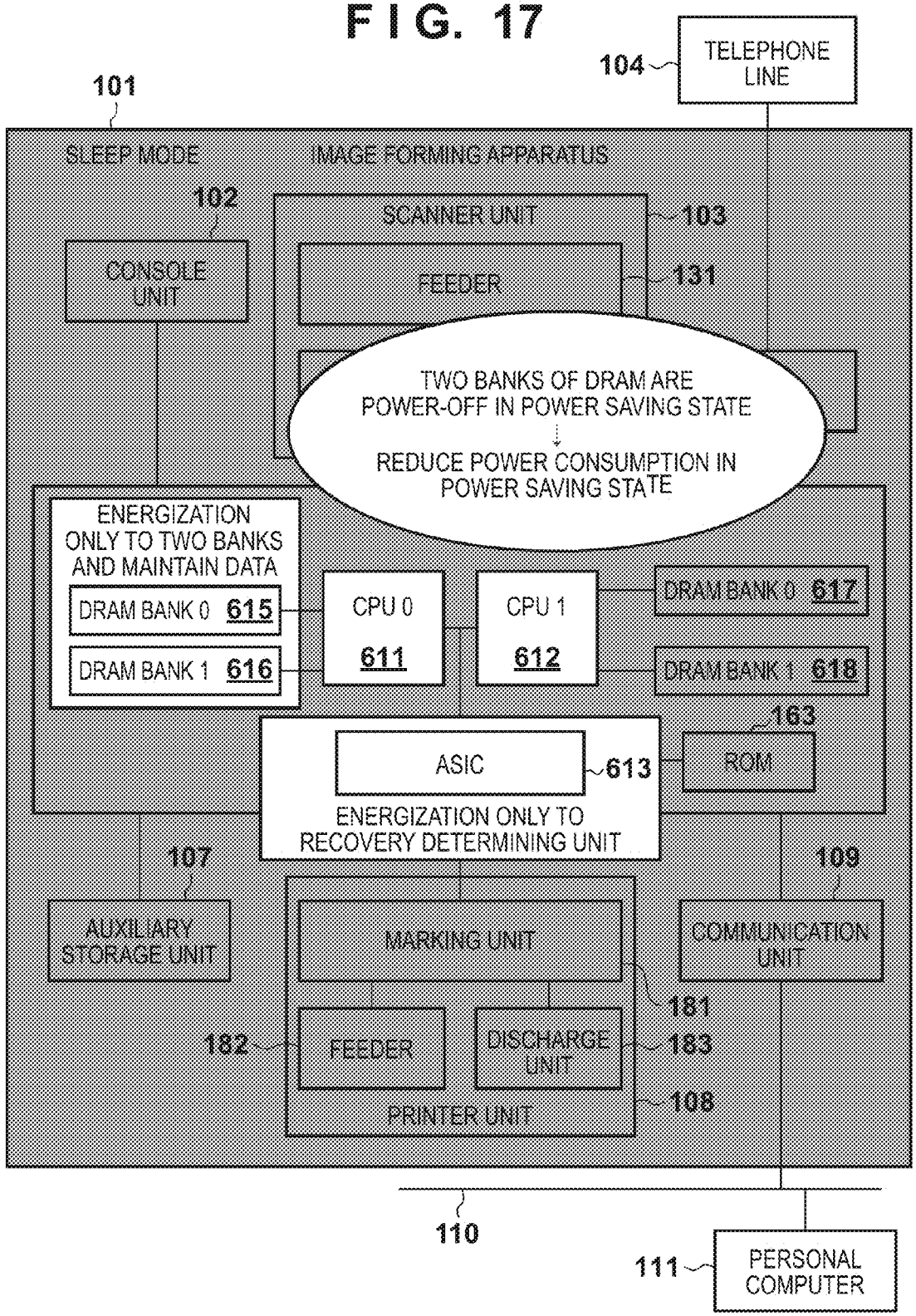
FIG. 17 is a block diagram for explaining an effect of the fifth embodiment.

FIG. 17 is a block diagram for explaining effects of the fifth embodiment. Common parts with FIG. 15 are indicated with the same reference numeral, and their explanation will be omitted. Also, in FIG. 17, locations which are not supplied electric power are indicated with gray.

In this way, according to the fifth embodiment, for the main controller of the image forming apparatus that is transitioned into the power saving state, further reduction of electric power consumption when waiting as shown in FIG. 17 can be realized by not performing periodic energization to a portion of the DRAM.

The content described above to explaining each of the embodiments comprises examples of solutions of the problem and does not restrict the present invention.

It will be appreciated that the present invention is not limited to the embodiments described above, but there can be various transformations (including combinations of each embodiments) based on the spirit of the invention, and these various transformations are not excluded from the scope of the present invention. Explanation was given showing a variety of the embodiments as examples of the present invention, and if one is skilled in the art, it will be appreciated that the spirit of the invention and the scope are not limited by the particular explanation of this specification.

For example, in previously described FIG. 1, the electric power is supplied to the printer unit 108 and the electric power supply to the scanner unit 103 is stopped when a printing function is used, while the electric power is supplied to the scanner unit 103 and the electric power supply to the printer unit 108 is stopped when a scanner function is used. At this time, in the image forming apparatus 101, the DRAM bank can be allocated as follows.

The scanner unit 103: the DRAM bank 2
The printer unit 108: the DRAM bank 3
Others: the DRAM bank 0 and bank 1

In such a case, the electric power supply to the DRAM bank 2 allocated to the scanner unit 103 is stopped and the DRAM bank 3 allocated to the printer unit 108 is caused to transition into the self-refresh mode in a case where the printing function of the image forming apparatus 101 is used. Also, the electric power supply to the DRAM bank 3 allocated to the printer unit 108 is stopped and the DRAM bank 2 allocated to the scanner unit 103 is caused to transition into the self-refresh mode in a case where the scanner function is used.

With this, when a particular function is executed, the electric power supply to a device not used in the particular function is stopped automatically and the electric power supply to the DRAM bank allocated to the device whose electric power supply is stopped is also stopped, so the electric power consumption of the image forming apparatus 101 can be reduced more.

[Other Embodiments]

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™) the present invention can also be realized by a computer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-200522, filed Sep. 26, 2013, which is hereby incorporated by reference herein in its entirety.

What is claimed is:

1. An image processing apparatus having a plurality of functional units that respectively execute predetermined functions, the apparatus comprising:
a memory storing a set of instructions; and
one or more processors that execute instructions of the set of the instructions and cause the image processing apparatus to function as:
a management unit configured to manage a memory with a plurality of areas;
an allocation unit configured to allocate the plurality of areas of the memory to the plurality of functional units respectively;
a power control unit configured to control to supply an electric power to the plurality of functional units and the plurality of areas of memory;
a determination unit configured to determine whether or not a condition for transition to a power saving state is satisfied; and
a control unit configured to control to, in a case that the determination unit determines that the condition is satisfied, cause the power control unit to stop an electric power supply to at least one of the plurality of functional units and an area of the memory allocated to the at least one functional unit to which the electric power supply is stopped to transition into the power saving state, and to cause an area of the memory allocated to a functional unit to which the electric power supply is maintained to transition into a self-refresh mode.

2. The image processing apparatus according to claim 1, wherein the control unit causes the area of the memory allocated to the functional unit to which the electric power supply is maintained to transition into the self-refresh mode for power saving with a refresh cycle in which an energization interval is made to be longest within a range in which data stored in the area of the memory allocated is maintained.

3. The image processing apparatus according to claim 1, wherein the management unit manages the memory with banks.

4. The image processing apparatus according to claim 1, wherein the management unit manages the memory with areas that are accessed in an interleave.

5. The image processing apparatus according to claim 1, wherein, the control unit, upon recovery from the power saving state, initiates a refreshing of an area of the memory allocated to a functional unit, which operates in a state entered upon recovery from the power saving state, and leaves stopped a refreshing of an area of the memory allocated to a functional unit, which does not operate in the state entered upon recovery from the power saving state.

6. The image processing apparatus according to claim 1, wherein the control unit has a first CPU and a second CPU, and the management unit allocates to each of the first CPU and the second CPU an area of the memory, and the first CPU, when, in the power saving state, the electric power supply is stopped to the at least one of the plurality of functional units, stops a refreshing of an area of the memory, which is connected to the second CPU and allocated to the functional unit to which the electric power supply is stopped.

7. A method of controlling an image processing apparatus having a plurality of functional units that respectively execute predetermined functions and a power control unit configured to control to supply an electric power to the plurality of functional units, the method comprising:

managing a memory with a plurality of areas;

allocating the plurality of areas of the memory to the plurality of functional units respectively;

determining whether or not a condition for transition to a power saving state is satisfied; and controlling to, in a case that it is determined that the condition is satisfied cause the power control unit to stop an electric power supply to at least one of the plurality of functional units and an area of the memory allocated to the at least one functional unit to which the electric power supply is stopped to transition into the power saving state, and to cause an area of the memory allocated to a functional unit to which the electric power supply is maintained to transition into a self-refresh mode.

8. A non-transitory computer readable storage medium storing a program for causing a computer to execute a method of controlling an image processing apparatus having a plurality of functional units that respectively execute predetermined functions and a power control unit configured to control to supply an electric power to the plurality of functional units, the method comprising:

managing a memory with a plurality of areas;

allocating the plurality of areas of the memory to the plurality of functional units respectively;

determining whether or not a condition for transition to a power saving state is satisfied; and controlling to, in a case that it is determined that the condition is satisfied cause the power control unit to stop an electric power supply to at least one of the plurality of functional units and an area of the memory allocated to the at least one functional unit to which the electric power supply is stopped to transition into the power saving state, and to cause an area of the memory allocated to a functional unit to which the electric power supply is maintained to transition into a self-refresh mode.

* * * * *